(12) United States Patent
Boukai et al.

(10) Patent No.: US 9,515,246 B2
(45) Date of Patent: Dec. 6, 2016

(54) SYSTEMS AND METHODS FOR FORMING THERMOELECTRIC DEVICES

(71) Applicant: Silicium Energy, Inc., Menlo Park, CA (US)

(72) Inventors: Akram I. Boukai, San Francisco, CA (US); Douglas W. Tham, Santa Clara, CA (US); Adam Hopkins, San Francisco, CA (US)

(73) Assignee: SILICIUM ENERGY, INC., Menlo Park, CA (US)

( * ) Notice: Subject to any disclaimer, the term of this patent is extended or adjusted under 35 U.S.C. 154(b) by 61 days.

(21) Appl. No.: 14/624,506

(22) Filed: Feb. 17, 2015

(65) Prior Publication Data

US 2015/0228883 A1  Aug. 13, 2015

Related U.S. Application Data

(63) Continuation of application No. PCT/US2013/055462, filed on Aug. 16, 2013.

(60) Provisional application No. 61/684,681, filed on Aug. 17, 2012.

(51) Int. Cl.
*H01L 35/34* (2006.01)
*H01L 35/32* (2006.01)
*B82Y 40/00* (2011.01)

(52) U.S. Cl.
CPC ............... *H01L 35/34* (2013.01); *H01L 35/32* (2013.01); *B82Y 40/00* (2013.01)

(58) Field of Classification Search
CPC ........ H01L 35/34; H01L 35/32; B82Y 40/00
See application file for complete search history.

(56) References Cited

U.S. PATENT DOCUMENTS

| | | |
|---|---|---|
| 3,653,989 A | 4/1972 | Widmer |
| 4,078,945 A | 3/1978 | Gonsiorawski |
| 4,092,445 A | 5/1978 | Tsuzuki et al. |
| 4,681,657 A | 7/1987 | Hwang et al. |
| 5,089,293 A | 2/1992 | Bohara et al. |
| 5,139,624 A | 8/1992 | Searson et al. |
| 5,206,523 A | 4/1993 | Goesele et al. |

(Continued)

FOREIGN PATENT DOCUMENTS

| | | |
|---|---|---|
| CN | 1382626 A | 12/2002 |
| JP | 2004193526 A | 7/2004 |

(Continued)

OTHER PUBLICATIONS

Huang, et al. Metal-assisted chemical etching of silicon: a review. Adv Mater. Jan. 11, 2011;23(2):285-308. doi: 10.1002/adma.201001784.*

(Continued)

*Primary Examiner* — Armando Rodriguez
(74) *Attorney, Agent, or Firm* — Wilson Sonsini Goodrich & Rosati

(57) ABSTRACT

A vapor phase method for forming a thermoelectric element comprises providing a substrate in a reaction space, the substrate including a pattern of a metallic material adjacent to the substrate, which metallic material is configured to catalyze the oxidation of the substrate. The metallic material is then exposed to a gas having an oxidizing agent and a chemical etchant to form holes in or wires from the substrate.

19 Claims, 15 Drawing Sheets

(56) References Cited

U.S. PATENT DOCUMENTS

| | | | |
|---|---|---|---|
| 5,552,328 | A | 9/1996 | Orlowski et al. |
| 5,565,084 | A | 10/1996 | Lee et al. |
| 5,695,557 | A | 12/1997 | Yamagata et al. |
| 5,767,020 | A | 6/1998 | Sakaguchi et al. |
| 5,868,947 | A | 2/1999 | Sakaguchi et al. |
| 5,873,003 | A | 2/1999 | Inoue et al. |
| 5,895,223 | A | 4/1999 | Peng et al. |
| 5,970,361 | A | 10/1999 | Kumomi et al. |
| 5,981,400 | A | 11/1999 | Lo |
| 5,990,605 | A | 11/1999 | Yoshikawa et al. |
| 6,017,811 | A | 1/2000 | Winton et al. |
| 6,093,941 | A | 7/2000 | Russell et al. |
| 6,313,015 | B1 | 11/2001 | Lee et al. |
| 6,762,134 | B2 | 7/2004 | Bohn et al. |
| 6,790,785 | B1 | 9/2004 | Lin et al. |
| 6,803,260 | B2 | 10/2004 | Shin et al. |
| 6,882,051 | B2 | 4/2005 | Majumdar et al. |
| 7,075,161 | B2 | 7/2006 | Barth |
| 7,115,971 | B2 | 10/2006 | Stumbo et al. |
| 7,135,728 | B2 | 11/2006 | Duan et al. |
| 7,161,168 | B2 | 1/2007 | Heath et al. |
| 7,189,435 | B2 | 3/2007 | Tuominen et al. |
| 7,190,049 | B2 | 3/2007 | Tuominen et al. |
| 7,254,953 | B2 | 8/2007 | Callas et al. |
| 7,291,282 | B2 | 11/2007 | Tong |
| 7,309,830 | B2 | 12/2007 | Zhang et al. |
| 7,465,871 | B2 | 12/2008 | Chen et al. |
| 7,569,941 | B2 | 8/2009 | Majumdar et al. |
| 7,572,669 | B2 | 8/2009 | Tuominen et al. |
| 7,629,531 | B2 | 12/2009 | Stark |
| 7,645,625 | B2 | 1/2010 | Ono et al. |
| 7,675,084 | B2 | 3/2010 | Wierer, Jr. et al. |
| 7,960,258 | B2 | 6/2011 | Chao et al. |
| 8,087,254 | B2 | 1/2012 | Arnold |
| 8,101,449 | B2 | 1/2012 | Liang et al. |
| 8,278,191 | B2 | 10/2012 | Hildreth et al. |
| 8,324,699 | B2 | 12/2012 | Ichijo et al. |
| 8,486,843 | B2 | 7/2013 | Li et al. |
| 8,641,912 | B2 | 2/2014 | Heath et al. |
| 9,065,016 | B2 | 6/2015 | Peter et al. |
| 9,209,375 | B2 | 12/2015 | Boukai et al. |
| 9,263,662 | B2 | 2/2016 | Boukai I et al. |
| 2004/0152240 | A1 | 8/2004 | Dangelo |
| 2005/0133254 | A1 | 6/2005 | Tsakalakos |
| 2005/0176264 | A1 | 8/2005 | Lai et al. |
| 2005/0215063 | A1 | 9/2005 | Bergman |
| 2005/0253138 | A1 | 11/2005 | Choi et al. |
| 2006/0032526 | A1 | 2/2006 | Fukutani et al. |
| 2006/0118158 | A1 | 6/2006 | Zhang et al. |
| 2006/0185710 | A1 | 8/2006 | Yang et al. |
| 2007/0258213 | A1 | 11/2007 | Chen et al. |
| 2007/0277866 | A1 | 12/2007 | Sander et al. |
| 2008/0019876 | A1 | 1/2008 | Chau et al. |
| 2008/0173344 | A1 | 7/2008 | Zhang et al. |
| 2008/0271772 | A1 | 11/2008 | Leonov et al. |
| 2008/0314429 | A1 | 12/2008 | Leonov |
| 2009/0020148 | A1 | 1/2009 | Boukai et al. |
| 2009/0020188 | A1 | 1/2009 | Ulicny et al. |
| 2009/0117741 | A1 | 5/2009 | Heath et al. |
| 2010/0035163 | A1 | 2/2010 | Kobrin |
| 2010/0065810 | A1 | 3/2010 | Goesele et al. |
| 2010/0126548 | A1 | 5/2010 | Jang et al. |
| 2010/0147350 | A1 | 6/2010 | Chou et al. |
| 2010/0193001 | A1 | 8/2010 | Hirono et al. |
| 2010/0248449 | A1 | 9/2010 | Hildreth et al. |
| 2011/0114145 | A1 | 5/2011 | Yang et al. |
| 2011/0114146 | A1 | 5/2011 | Scullin |
| 2011/0168978 | A1 | 7/2011 | Kochergin |
| 2011/0179911 | A1 | 7/2011 | Ipposhi et al. |
| 2011/0215441 | A1 | 9/2011 | Lin et al. |
| 2011/0263119 | A1 | 10/2011 | Lin et al. |
| 2011/0266521 | A1 | 11/2011 | Ferrari et al. |
| 2012/0097204 | A1 | 4/2012 | Yu et al. |
| 2012/0152295 | A1 | 6/2012 | Matus et al. |
| 2012/0160290 | A1 | 6/2012 | Chen et al. |
| 2012/0167936 | A1 | 7/2012 | Park et al. |
| 2012/0174956 | A1 | 7/2012 | Smythe et al. |
| 2012/0217165 | A1 | 8/2012 | Feng et al. |
| 2012/0282435 | A1 | 11/2012 | Yang et al. |
| 2012/0290051 | A1 | 11/2012 | Boyden et al. |
| 2012/0295074 | A1 | 11/2012 | Yi et al. |
| 2012/0319082 | A1 | 12/2012 | Yi et al. |
| 2012/0326097 | A1 | 12/2012 | Ren et al. |
| 2013/0019918 | A1 | 1/2013 | Boukai et al. |
| 2013/0052762 | A1 | 2/2013 | Li et al. |
| 2013/0087180 | A1 | 4/2013 | Stark et al. |
| 2013/0175484 | A1 | 7/2013 | Ren et al. |
| 2013/0186445 | A1 | 7/2013 | Lorimer et al. |
| 2014/0117380 | A1 | 5/2014 | Loboda et al. |
| 2014/0306250 | A1 | 10/2014 | Gardner et al. |
| 2014/0326287 | A1 | 11/2014 | Wiant et al. |
| 2014/0373888 | A1 | 12/2014 | Boukai et al. |
| 2015/0083180 | A1 | 3/2015 | Lang |
| 2015/0101788 | A1 | 4/2015 | Smith et al. |
| 2015/0162517 | A1 | 6/2015 | Kasichainula |
| 2015/0179911 | A1 | 6/2015 | Lemmer et al. |
| 2015/0216718 | A1 | 8/2015 | Diller et al. |
| 2015/0280099 | A1 | 10/2015 | Boukai et al. |
| 2015/0325772 | A1 | 11/2015 | Boukai I et al. |
| 2016/0035956 | A1 | 2/2016 | Carroll et al. |
| 2016/0197259 | A1 | 7/2016 | Boukai I et al. |

FOREIGN PATENT DOCUMENTS

| | | |
|---|---|---|
| WO | WO 02/23607 A1 | 3/2002 |
| WO | WO 2010/003629 A2 | 1/2010 |
| WO | WO 2011/049804 A2 | 4/2011 |
| WO | WO-2012068426 A2 | 5/2012 |
| WO | WO-2013012842 A1 | 1/2013 |
| WO | WO 2013/109729 A1 | 7/2013 |
| WO | WO 2014/028903 A1 | 2/2014 |
| WO | WO-2014070795 A1 | 5/2014 |
| WO | WO 2014/179622 A1 | 11/2014 |
| WO | WO 2015/134394 A1 | 9/2015 |

OTHER PUBLICATIONS

U.S. Appl. No. 14/700,082, filed Apr. 29, 2015, Boukai et al.
International search report and written opinion dated Jul. 3, 2015 for PCT Application No. US2015/022312.
Notice of allowance dated Jul. 29, 2015 for U.S. Appl. No. 12/175,027.
Office action dated Jun. 16, 2015 for U.S. Appl. No. 13/278,074.
Silverstein, et al. Porous polymers. John Wiley & Sons, 2011.
Notice of allowance dated Oct. 8, 2015 for U.S. Appl. No. 14/667,177.
Office action dated Aug. 28, 2015 for U.S. Appl. No. 13/550,424.
"Chen, et al. Dispenser Printed Microscale Thermoelectric Generators for Powering Wireless Sensor Networks. Paper No. IMECE2009-11636, pp. 343-352; 10 pages."
Co-pending U.S. Appl. No. 14/989,225, filed Jan. 6, 2016.
European search report and opinion dated Feb. 26, 2016 for EP Application No. 13829134.9.
"Notice of allowance dated Jan. 22, 2016 for U.S. Appl. No. 14/667,177."
"Notice of allowance dated Dec. 10, 2015 for U.S. Appl. No. 14/667,177."
Notice of allowance dated Nov. 6, 2015 for U.S. Appl. No. 14/667,177.
Office action dated Nov. 17, 2015 for U.S. Appl. No. 14/372,443.
Office action dated Nov. 18, 2015 for U.S. Appl. No. 13/278,074.
Wolfsteller; et al., Comparison of the top-down and bottom-up approach to fabricate nanowire-based silicon/germanium heterostructures. Thin Solid Films 518.9 (2010): 2555-2561.
Agnes, et al. Doping of the nanocrystalline semiconductor zinc oxide with the donor indium, Amer Institute of Phystcs, vol. 83, No. 6, 1204, (Aug. 11, 2003).
Beckman, et al. Fabrication of Conducting. Silicon nanowire Arrays, J. Appi. Phys. 96 (10), 5921-5923 (2004).

(56) References Cited

OTHER PUBLICATIONS

Beckman, et al., Bridging Dimensions: Demultiplexing Ultrahigh-Density nanowire Circuits, Science 2005, 310: 465-468.
Behnen. Quantitative examination of the thermoelectric power of n-typesilicon in the phono drag regime. Journal of Applied Physics, vol. 67, pp. 287-292, Jan. 1, 1990.
Bera, et al. Marked Effects of Alloying on the Thermal Conductivity of nanoporous Materials, Mar. 19, 2010, American Physical Society Physical Review Letters, 104, pp. 115502-01 to 115502-4.
Boukai, et al. Silicon nanowires as efficient thermoelectric materials. nature, vol. 451, pp. 168-171, Jan. 10, 2008.
Boukai, et al. Size-Dependent transport and thermoelectric properties of individual polycrystalline bismuth nanowires. Advanced Materials, 18, pp. 864-869, 2006.
Boukai. Thermoelectric properties of bismuth and silicon nanowires. Dissertation (Ph.D.), California Institute of Technology. 2008.
Bunimovich, et al. Quantitative Real-Time Measurements of DnA Hybridization with Alkylated nonoxidized Silicon nanowires in Electrolyte Solution, JACS 2006, 128: 16323-16331.
Chadwick, et al. Plane waves in an elastic solid conducting heat. Journal of the Mechanics and Physics of Solids 6, 223-230 (1958).
Chen, et al. Recent developments in thermoelectric materials. International Materials Reviews, vol. 48, pp. 4566, 2003.
Choi, et al. Fabrication of bismuth nanowires with a silver nanocrystal shadowmask, J. Vac. Sci. Tech. A—Vac. Surf. and Films, 18, 1236, 1328 (2000).
Choi, et al. Fabrication of nanometer size photoresist wire patterns With a silver nanocrystal shadowmask. J. Vac. Sci. & Tech. A—Vac. Surf. and Films, 17, 1425 (1999).
Chung, et al. Fabrication and Alignment of Wires in Two-Dimensions. The Journal of PhysiCal Chemistry B. 102. 6685 (1998).
Collier, et al. nanocrystal superlattices. Annu. Rev. Phys. Chem. 1998, 49: 371-404.
Deresiewicz. Plane waves in a thermoelastic solid. Journal of the Acoustical Society of America 29, 204-209 (1957).
Diehl, et al. Self-Assembly of Deterministic Carbon nanottibe Wiring networks. Angew. Chem. Int Ed. 41, 353 (2002).
European search report and opinion dated Mar. 25, 2014 for EP Application No. 11835180.8.
Fan, et al. Self-Oriented Regular Arrays of Carbon nanotubes and their Field Emission Devices. Science, v. 283, p. 512 (Jan. 22, 1999).
Geballe, et al. Seebeck Effect in Silicon. Physical Review, vol. 98, pp. 940-947, May 15, 1955.
Green, et al., A 160-kilobit molecular electronic memory patterned at 1011 bits per square centimeter, nature 2007, 445: 414-417.
Gurevich. Thermoelectric properties of conductors J. Phys. (U.S.S.R.) 9, 477 (1945).
Harman, et al. Quantum dot superlattice thermoelectric materials and devices. Science, vol. 297, pp. 22292232, Sep. 27, 2002.
Haynes, et al. Nanosphere Lithography: A Versatile nanofabrication Tool for Studies of Size-Dependent nanoparticle Optics. J. Phys. Chem. B, 105, 5599-5611 (2001).
Heath, et al. A Defect-Tolerant Computer Architecture: Opportunities for nanotechnology, Science 1998, 280: 1716-1721.
Heath, et al. Pressure/Temperature Phase Diagrams and Superlattices of Organically Functionalized Metal nanocrystal Monolayers: The Influence of Particle Size, Size Distribution, and Surface Passivant, J. Phys. Chem. B 1997, 101: 189-197.
Herring. Theory of the thermoelectric power of semiconductors. Physical Review, vol. 96, No. 5, pp. 11631187, 1954.
Hicks, et al.. Thermoelectric figure of merit of a one-dimensional conductor. Physical Review B 47, 1 6631-1 6634 (1993).
Hochbaum, et al. Enchanced thermoelectric performance of rough silicon nanowires, Jan. 2008, nature Publishing Group, vol. 451, pp. 1-6.
Hsu, et al. Cubic AgPbmSbTe2+m: Bulk thermoelectric materials with high Figure of Merit. Science, vol. 303, pp. 818-821, Feb. 6, 2004.

Huang, et al. Spontaneous formation of nanoparticle strip patterns through dewetting. nature Materials vol. 4, p. 896 (2005).
Hulteen, et al. nanosphere lithography: A materials general fabrication process for periodic particle array surfaces, J. Vac. Sci. Technol. 1995, 13: 1553-1558.
Humphrey, et al. Reversible thermoelectric nanomaterials. Physical Review Letters 94, 096601 (2005).
Husain, et al. Nanowire-based very-high-frequency electromechanical resonator. Applied physics letters, vol. 83, No. 6, Aug. 11, 2003, pp. 1240-1242.
Ihab, et al. Manipulation of thermal phonons: a phononic crystal route to high-ZT thermoelectrics. Photonic and Phononic Properties of Engineered nanostructures, SPIE. 1000 20th St. Bellingham, WA 98225-6705. Feb. 10, 2011; 7946:1-9.
International search report and written opinion dated Feb. 9, 2009 for PCT/US2008/070309.
International search report and written opinion dated Apr. 15, 2009 for PCT/US2008/064439.
International search report and written opinion dated Apr. 26, 2013 for PCT/US2013/021900.
International search report and written opinion dated May 29, 2012 for PCT/US2011/057171.
International search report and written opinion dated Jul. 17, 2012 for PCT Application No. PCT/US2012/047021.
International search report and written opinion dated Dec. 27, 2013 for PCT/US2013/055462.
International search report dated Feb. 10, 2014 for PCT/US2013/067346.
Joannopoulos, et al. Photonic crystals: putting a new twist on light, nature 1997, 386: 143-149.
Jung, et al. Circuit Fabrication at 17 nm Half-Pitch by nanoimprint-tithography. nanoLetters, 6, 351 (2006).
Koga, et al. Experimental proof-of-principle investigation of enhanced Z3DT in (100) oriented Si/Ge superlattices. Applied Physics Letters 77, 1490-1492 (2000).
Lee, et al Nanoporous Si as an Efficient Thermoelectric Material. nano Letter, 8, 2008, 3750-3754.
Lee, et al. Enhanced thermoelectric figure-of-merit in nanostructured p-type silicon germanium bulk alloys. nano. Lett. 2008; 8(12):4670-4674.
Lee, et al. Nanostructured bulk thermoelectric materials and their properties. ICT 2005. 24th International Conference on Thermoelectrics (ICT). 2005 284-287.
Li, et al. Measuring thermal and thermoelectric properties of one-dimensional nanostructures using a microfabricated device. Journal of heart transfer, vol. 125, pp. 881-888, Oct. 2003.
Li, et al. Thermal conductivity of individual silicon nanowires. Applied Physics Letters, vol. 83, pp. 2934-2936, Oct. 6, 2003.
Lifshitz, et al. Thermoelastic damping in micro- and nanomechanical systems. Physical Review B 61, 5600-5609 (2000).
Liu, et al. Thermal conduction in ultrahigh pure and doped single-crystal silicon layers at high temperatures. Journal of Applied Physics 98, 123523 (2005).
Llaguno, et al. Observation of thermopower oscillations in the coulomb blockade regime in a semiconducting carbon nanotube. nano Lett. 4, 45-49 (2004).
Mahan, et al. The best thermoelectric. PnAS 93, 7436-7439 (1996).
Mahan, et al. Thermoelectric materials: new approaches to an old problem. Physics Today 50, pp. 42-47, Mar. 1997.
Majumdar. Thermoelectricity in Semiconductor nanostructures. Science Feb. 6, 2004; 303(5659):777-778. DOI: 10.1126/science.1093164.
Maranganti, et al. Length scales at which classical elasticity breaks down for various materials. Physical Review Letters 98, 195504 (2007).
Martin. Nanomaterials—A membrane based synthetic approach. Science, v. 266, p. 1961-1966 (Dec. 23, 1994).
Melosh, et al. Ultra-high density nanowire lattices and circuits. Science, vol. 300, pp. 112-115,Apr. 4, 2003.
Morales, et al. A laser ablation method for the synthesis of semiconductor crystalline nanowires. Science, vol. 279, pp. 208-211, Jan. 9, 1998.

(56) References Cited

OTHER PUBLICATIONS

NDT Resource Center, Thermal Conductivity. Downloaded Nov. 26, 2013. https://www.nde-ed.org/EducationResources/CommunityCollege/Materials/Physical_Chemical/ThermalConductivity.htm.
Notice of allowance dated Jul. 13, 2011 for U.S. Appl. No. 12/125,043.
Notice of allowance dated Oct. 2, 2013 for U.S. Appl. No. 12/125,043.
Office action dated Jan. 9, 2015 for U.S. Appl. No. 12/175,027.
Office action dated Jan. 23, 2015 for U.S. Appl. No. 13/278,074.
Office action dated Feb. 12, 2015 for U.S. Appl. No. 13/550,424.
Office action dated Feb. 18, 2011 for U.S. Appl. No. 12/125,043.
Office action dated Apr. 25, 2013 for U.S. Appl. No. 13/278,074.
Office action dated May 23, 2013 for U.S. Appl. No. 12/175,027.
Office action dated Jun. 22, 2011 for U.S. Appl. No. 12/175,027.
Office action dated Jun. 30, 2014 for U.S. Appl. No. 12/175,027.
Office action dated Jul. 18, 2014 for U.S. Appl. No. 13/278,074.
Office action dated Aug. 7, 2013 for U.S. Appl. No. 13/278,074.
Office action dated Nov. 10, 2010 for U.S. Appl. No. 12/175,027.
Office action dated Nov. 27, 2013 for U.S. Appl. No. 12/175,027.
Pearson. Survey of thermoelectric studies of the group-1 metals at low temperatures carried out at the national-research-laboratories, Ottawa. Soviet Physics-Solid State 3, 1024-1033 (1961).
Peng, et al. Ordered silicon nanowire'arrays via nanosphere lithography and metal induced etching. Applied Physics Letters, v.90, article # 163123 (2007).
Prasher. Thermal conductivity of composites of aligned nanoscale and microscale wires and pores. Journal of Applied Physics, 100, 034307, 2006, p. 1-9.
Qiu, et al. Large complete band gap in two-dimensional photonic crystals with elliptic air holes, Physical Review B 1999, 60: 10 610-10 612.
Routkevitch, et al. Electrochemical Fabrication of CdS nanowires arrays in porous anodic aluminum oxide templates. The Journal of Physical Chemistry, v. 100, p. 14037-14047 (1996).
She, et al. Fabrication of vertically aligned Si nanowires and their application in a gated field emission device. Applied Physics Letters. v; 88. article # 013112 (2006).
Small, et al. Modulation of thermoelectric power of individual carbon nanotubes. Physical Review letters, vol. 91, pp. 256801-1 to 256801-4, 2003.
Snyder, et al. Thermoelectric microdevice fabricated by a MEMS-like electrochemical process. nature Material, vol. 2, pp. 528-531, Aug. 2003.
Tang, et al. Holey silicon as an efficient thermoelectric material. nano. Lett. 2010; 10:4279-4283.
Tao, et al. Langrfluir Blodgett Silver nanowire Monolayers for Molecular Sensing Using Surface-Enhanced Raman Spectroscopy. nanoLetters 3, 1229 (2003).
Trzcinski, et al. Quenched Phonon Drag in Silicon Microcontacts. Physical Review Letters, vol. 56, No. 10, pp. 1086-1089, 1986.
U.S. Appl. No. 14/667,177, filed Mar. 24, 2015 Unpublished .
Vekatasubramanian, et al. Thin-film thermoelectric devices with high room-temperature figures of merit. nature, vol. 413, pp. 597-602, Oct. 11, 2001.
Vining. Desperately seeking silicon. nature, vol. 451, pp. 132-133, Jan. 10, 2008.
Vossmeyer, et al. Light-directed assembly of nanoparticles, Angew. Chem. Int. Ed. Engl. 1997, 36: 1080-1083.
Wang, et al. A new type of lower power thermoelectric microgenerator fabricated by nanowire array thermoelectric material. Microelectronic Engineering. 2005; 77:223-229.
Wang, et al. Complementary Symmetry Silicon nanowire Logic: Power-Efficient Inverters with Gain, Small 2006, 2: 1153-1158.
Wang, et al. Oxidation Resistant Germanium nanowires:. Bulk. Synthesis. Long Chain Alkahethioi Functionalization, and Langmuir-Blodgett Assembly. Journal of the American Chemical Society, 127, 11871 (2005).
Wang, et al. Surface Chemistry and Electrical Properties of Germanium nanowires, JACS 2004, 126: 11602-11611.
Wang, et al. Use of phopshine as an n-type dopant source for vapor-liquid-solid growth of silicon nanowires. nano Letters. 2005; 5(11):2139-2143.
Wang, et al., Silicon p-FETs from Ultrahigh Density nanowire Arrays, nano Letters 2006, 6: 1096-1100.
Weber, et al. Silicon-nanowire transistors with Intruded nickel-Silicide Contacts. nano Letters v. 6, p. 2660-2666 (2006).
Weber, et al. Transport properties of silicon. Applied Physics A: Solids and Surfaces, pp. 136-140, 1991.
Whang, et al. Large-Scale Hierarchical Organization of nanowire Arrays for Integrated nanosystems. nanoLetters 3, 1255-1259 (2003).
Williams, et al. Etch rates for micromachining processing. Journal of Microelectromechanical Systems 5, 256-269 (1996).
Wu, et al. Single-crystal metallic nanowires and meta semiconductor nanowires heterostructures. nature, 430. p. 61 (2004).
Xu, et al. Controlled fabrication of long quasione-dimensional superconducting nanowire arrays. nano letters, vol. 8, No. 1, Dec. 6, 2007, pp. 136-141.
Yablonovitch. Photonic band-gap structures, J. Opt. Soc. Am. B. 1993, 10: 283-297.
Yang, et al. Encoding Electronic Properties.by Synthesis of Axial Modulation Doped Silicon nanowires. Science, 310, p. 1304 (2005).
Yang, et al. Single p-Type/Intrinsic/n-TypeSilicon nanowires as nanoscale Avalanche Photodetectors, nano Letters 2006, 6: 2929-2934.
Yang, et al. Thermal conductivity of simple and tubular nanowire composites in the longitudinal direction. Physiucal Review B, 72, 125418, 2005, p. 1-7.
Yu, et al. Reduction of thermal conductivity in phononic nanomesh structures. nature nanotechnology. 2010; 5:718-721.
Yu-Ming, et al. Semimetal-semicinductor transition in bi1_xSbx alloy nanowires and their thermoelectric properties. Applied Physics Letter, Volov. 81, No. 13, pp. 2403-2405, Sep. 23, 2002.
Zener, et al. Internal friction in solids III. Experimental demonstration of thermoelastic internal friction. Physical Review 53, 100-101 (1938).
Zener. Internal friction in solids I. Theory of internal friction in reeds. Physical Review 52, 230-235 (1937).
Zhong, et al. Nanowire Crossbar Arrays as Address Decoders for Integrated nanosystems, Science 2003, 302: 1377-1379.
Zhou, et al. Verticaly aligned Zn2SiO4 nanotube/ZnO nanowire Heterojunction Arrays. Small, v.3. p. 622-626 (2007).
Zhou. Determination of transport properties in chromium disilicide nanowires via combined thermoelectric and structural characterizations. nano Letters 7, 1649-1654 (2007).
Notice of allowance dated Jun. 15, 2016 for U.S. Appl. No. 13/278,074.
Office action dated Jun. 23, 2016 for U.S. Appl. No. 14/372,443.
Office action dated Jun. 29, 2016 for U.S. Appl. No. 13/550,424.
Sialon Ceramics. Downloaded May 6, 2013. http://www.sialon.com.au/high-temperature-seebeck-probes.htm.
Office action dated Oct. 7, 2016 for U.S. Appl. No. 14/989,225.

* cited by examiner

SYSTEMS AND METHODS FOR FORMING THERMOELECTRIC DEVICES

CROSS-REFERENCE

This application is a continuation application of PCT/US2013/055462, filed Aug. 16, 2013, which claims priority to U.S. Provisional Patent Application No. 61/684,681, filed Aug. 17, 2012, which is entirely incorporated herein by reference.

BACKGROUND

Over 15 Terawatts of heat is lost to the environment annually around the world by heat engines that require petroleum as their primary fuel source. This is because these engines only convert about 30 to 40% of petroleum's chemical energy into useful work. Waste heat generation is an unavoidable consequence of the second law of thermodynamics.

The term "thermoelectric effect" encompasses the Seebeck effect, Peltier effect and Thomson effect. Solid-state cooling and power generation based on thermoelectric effects typically employ the Seebeck effect or Peltier effect for power generation and heat pumping. The utility of such conventional thermoelectric devices is, however, typically limited by their low coefficient-of-performance (COP) (for refrigeration applications) or low efficiency (for power generation applications).

Thermoelectric device performance may be captured by a so-called thermoelectric figure-of-merit, $Z=S^2 \sigma/k$, where 'S' is the Seebeck coefficient, '$\sigma$' is the electrical conductivity, and 'k' is thermal conductivity. Z is typically employed as the indicator of the COP and the efficiency of thermoelectric devices—that is, COP scales with Z. A dimensionless figure-of-merit, ZT, may be employed to quantify thermoelectric device performance, where 'T' can be an average temperature of the hot and the cold sides of the device.

Applications of conventional semiconductor thermoelectric coolers are rather limited, as a result of a low figure-of-merit, despite many advantages that they provide over other refrigeration technologies. In cooling, low efficiency of thermoelectric devices made from conventional thermoelectric materials with a small figure-of-merit limits their applications in providing efficient thermoelectric cooling.

SUMMARY

Recognized herein is a need for enhanced thermoelectric materials, and methods for their fabrication. More particularly, there is a need for thermoelectric materials exhibiting an enhanced figure-of-merit.

A thermoelectric device may include a semiconductor substrate having a mesh (e.g., a plurality of holes) disposed between electrodes of the thermoelectric device. The holes of the mesh can have dimensions on the order of nanometers. In some cases, the holes can be filled with a metallic material, semiconductor, or insulator to provide inclusions. The inclusions can have dimensions on the order of nanometers.

In some cases, a thermoelectric device can include a semiconductor substrate and an array of nanostructures, such as wires or holes. The wires or holes may have dimensions on the order of nanometers, e.g., nanowires or nanoholes. The nanostructures can have a high aspect ratio and can be monodisperse. In some cases, the nanostructures are anchored to a semiconductor substrate, such as a silicon substrate.

The disclosure provides vapor phase methods for forming thermoelectric devices. In some cases, thermoelectric devices are formed with the aid of reactive species in the vapor phase. In other cases, thermoelectric devices are formed with the aid of reactive species in the vapor and liquid phases.

The performance of a thermoelectric device of the disclosure may be related to the properties and characteristics of holes and/or wires of thermoelectric elements of the device. In some cases, optimum device performance may be achieved for an element having holes or wires, an individual hole or wire having a surface roughness between about 0.1 nm and 50 nm, or 1 nm and 20 nm, or 1 nm and 10 nm, as measured by transmission electron microscopy (TEM). In some cases, a thermoelectric element may have a residual metal content between about 0.000001% and 25%, as measured by x-ray photoelectron spectroscopy (XPS). Such a metal may be adsorbed on a surface of the thermoelectric elements, such as exposed surfaces of holes or wires of the thermoelectric element.

In an aspect of the present disclosure, a method for forming a thermoelectric device comprises forming a mask adjacent to a substrate, the mask having three-dimensional structures distributed or otherwise provided within a polymer matrix. In some cases, the thermoelectric device can include one or more intervening layers (e.g., oxide layer(s)) between the mask and the substrate. In some cases, the three-dimensional structures may be phase-separated in the polymer matrix. The three-dimensional structures or the polymer matrix are then removed to expose portions of the substrate. Next, an etching layer is deposited adjacent to exposed portions of the substrate. The etching layer may include an etching material, such as a metallic material. The substrate is then catalytically etched using an oxidizing agent and a chemical etchant (also "etchant" herein). The etching layer and the substrate can be exposed to the oxidizing agent and/or etchant through gas phase exposure (e.g., the oxidizing agent and/or etchant are provided in the vapor phase).

In an embodiment, the three-dimensional structures are selectively removed in relation to the polymer matrix. In another embodiment, catalytically etching the substrate forms holes in the substrate. In another embodiment, an etch block layer is deposited on exposed portions of the substrate before depositing the etching layer, and the mask is removed. In another embodiment, the etch block layer comprises a material that reduces an etch rate of portions of the substrate that are adjacent to the etch block layer. In another embodiment, the etch block layer comprises chromium, molybdenum, tungsten, titanium, niobium, or combinations thereof. In another embodiment, catalytically etching the substrate forms wires in the substrate. In another embodiment, catalytically etching the substrate forms holes in the substrate. In another embodiment, the etching layer comprises gold, silver, platinum, chromium, molybdenum, tungsten, palladium, and/or other noble metals. In some embodiments, the etching layer comprises any combinations or alloys of gold, silver, platinum, chromium, molybdenum, tungsten, palladium, and/or other noble metals. In another embodiment, the three-dimensional structures are formed of a polymeric material. In another embodiment, the three-dimensional structures are formed of a block copolymer. In another embodiment, the mask is removed to expose portions of the substrate. In another embodiment, the substrate comprises one or more semiconductors. In another embodiment, the substrate comprises a layer of one or more semiconductors and one or more intervening layers adjacent to the layer.

In yet another aspect of the present disclosure, a method for forming a thermoelectric device comprises providing a polymer matrix adjacent to a substrate, the polymer matrix having three-dimensional structures phase-separated therein. Next, one of the three-dimensional structures and the polymer matrix is selectively removed in relation to the other to provide a mask that includes (i) a plurality of holes in the polymer matrix or (ii) the three-dimensional structures disposed adjacent to the substrate. The mask exposes portions of the substrate. The mask has a pattern that is characterized by the distribution of the plurality of holes or three-dimensional structures. Next, the pattern is catalytically transferred to the substrate by exposing the substrate to an oxidizing agent and a chemical etchant. One or both of the oxidizing agent and the chemical etchant can be exposed to the substrate through vapor phase exposure (e.g., the oxidizing agent and/or chemical etchant, as gases, can be brought in contact with the substrate).

Another aspect of the disclosure provides a method for forming a thermoelectric element, comprising (a) providing a substrate in a reaction space, the substrate having a pattern of a metallic material adjacent to the substrate, wherein the metallic material is configured to catalyze the oxidation of the substrate; and (b) exposing the metallic material to a gas having an oxidizing agent and a chemical etchant to form holes in or wires from the substrate. In some cases, both holes and wires can be formed in the substrate.

Another aspect of the disclosure provides a method for forming a thermoelectric element, comprising (a) providing a substrate in a reaction space, the substrate having a pattern of a metallic material adjacent to the substrate, wherein the metallic material is configured to catalyze the oxidation of the substrate; and (b) contacting the metallic material with a vapor phase oxidizing agent and a vapor phase chemical etchant to form holes in or wires from the substrate.

Another aspect of the disclosure provides a method for forming a thermoelectric element, comprising contacting a metallic material adjacent to a substrate with a vapor phase oxidizing agent and a vapor phase chemical etchant to form holes in or wires from the substrate at an etch rate of at least about 0.1 nanometer/second at an aspect ratio of at least about 20:1.

Another aspect of the present disclosure provides a method for forming a thermoelectric element that can be employed for use in a thermoelectric device or system. The method comprises (a) providing a substrate in a reaction space, wherein the substrate comprises a semiconductor material, wherein the substrate has a pattern of a metallic material adjacent to the substrate, which metallic material is configured to catalyze the oxidation of the substrate; (b) exposing the metallic material to a vapor phase oxidizing agent and a vapor phase chemical etchant; and (c) etching the substrate at an etch rate of at least about 0.01 micrometers/second to form holes in or wires from the substrate, thereby forming the thermoelectric element. In some embodiments, each of the holes or wires has an aspect ratio of at least about 20:1. In some embodiments, each of the holes or wires has an aspect ratio of at least about 1000:1. In some embodiments, the metallic material is exposed to the gas for a time period between about 30 seconds and 60 hours. In some embodiments, a ratio of oxidizing agent to chemical etchant in the gas is at least about 2:1. In some embodiments, the substrate is heated to a temperature between about −50° C. and 200° C. In some embodiments, the gas is heated to a temperature between about −50° C. and 200° C. In some embodiments, the metallic material comprises gold, silver, platinum, chromium, molybdenum, tungsten, palladium, or combinations thereof. In some embodiments, the substrate is etched at an etch rate of at least about 0.1 micrometers/second. In some embodiments, operation (a) further comprises: providing a mask adjacent to the substrate; forming a pattern of holes in the mask, wherein an individual hole exposes an oxide layer adjacent to the substrate; exposing the oxide layer to a vapor phase etchant to remove the oxide layer; depositing the metallic material adjacent to the substrate; and removing the mask. In some embodiments, the vapor phase etchant is hydrofluoric acid. In some embodiments, the metallic material is deposited through vapor phase deposition. In some embodiments, the method further comprises forming a passivation layer on an underside of the substrate prior to etching the substrate. In some embodiments, the method further comprises applying an electric field across the substrate while etching the substrate. In some embodiments, the substrate is exposed to the vapor phase oxidizing agent and the vapor phase chemical etchant simultaneously. In some embodiments, the substrate is exposed to the vapor phase oxidizing agent and the vapor phase chemical etchant alternately and sequentially. In some embodiments, the vapor oxidizing agent and the vapor phase chemical etchant are in the supercritical phase. In some embodiments, the vapor phase oxidizing agent is selected from the group consisting of $O_2$, $O_3$, $NO_2$ and $H_2O_2$. In some embodiments, the vapor phase chemical etchant is selected from the group consisting of HF, HCl, HBr and HI. In some embodiments, the thermoelectric element has a figure-of-merit of at least about 0.5.

Another aspect of the present disclosure provides a method for forming a thermoelectric element that can be employed for use in a thermoelectric device or system. The method comprises contacting a metallic material adjacent to a substrate with a vapor phase oxidizing agent and a vapor phase chemical etchant to form holes in or wires from the substrate at an etch rate of at least about 0.1 nanometer/second to form the thermoelectric element, wherein the holes or wires have an aspect ratio of at least about 20:1, and wherein surfaces of the substrate exposed by the holes or wires have a roughness between about 0.5 nanometers (nm) and 50 nm across the holes or wires as measured by transmission electron microscopy. In some embodiments, the aspect ratio of at least about 1000:1. In some embodiments, an individual hole or wire has a surface with a metal content of at least about 0.000001% as measured by x-ray photoelectron spectroscopy (XPS). In some embodiments, the substrate is simultaneously contacted with the vapor phase oxidizing agent and the vapor phase chemical etchant. In some embodiments, the substrate is alternately and sequentially contacted with the vapor phase oxidizing agent and the vapor phase chemical etchant. In some embodiments, the vapor phase oxidizing agent is selected from the group consisting of $O_2$, $O_3$, $NO_2$ and $H_2O_2$. In some embodiments, the vapor phase chemical etchant is selected from the group consisting of HF, HCl, HBr and HI. In some embodiments, the thermoelectric element has a figure-of-merit of at least about 0.5.

Another aspect of the present disclosure provides a method for forming a thermoelectric element that can be employed for use in a thermoelectric device or system. The method comprises (a) providing particles of a metallic material adjacent to a substrate, wherein the particles of the metallic material each has an Euler Characteristic <2; and (b) exposing the particles to an oxidizing agent and a chemical etchant to catalytically etch the substrate at an etch rate of at least about 0.01 micrometers/second to form holes in or wires from the substrate, thereby forming a thermoelectric element of the thermoelectric device. In some embodiments, operation (a) further comprises providing a mask adjacent to the substrate, the mask having an array of holes; depositing a layer of the metallic material adjacent to the mask and exposed portions of the substrate; and removing the mask to provide the particles of the metallic material adjacent to the substrate. In some embodiments, providing the mask further comprises forming the mask adjacent to the substrate, the mask having three-dimensional structures phase-separated in a polymer matrix; and removing the three-dimensional structures, thereby providing the holes in the polymer matrix, which holes expose portions of the substrate. In some embodiments, the metallic material comprises gold, silver, platinum, chromium, molybdenum, tungsten, palladium, or combinations thereof. In some embodiments, the particles are exposed to the oxidizing agent and the etchant in the gas phase. In some embodiments, the oxidizing agent and the etchant are in the supercritical phase. In some embodiments, each of the particles of the metallic material has an Euler Characteristic equal to zero. In some embodiments, the oxidizing agent is selected from the group consisting of $O_2$, $O_3$, $NO_2$ and $H_2O_2$. In some embodiments, the chemical etchant is selected from the group consisting of HF, HCl, HBr and HI. In some embodiments, the thermoelectric element has a figure-of-merit of at least about 0.5.

Another aspect of the present disclosure provides a system for forming a thermoelectric element, comprising one or more computer processors ("processors") and memory (or memory location) comprising machine executable code that, upon execution by the one or more computer processors, implements any of the methods above or elsewhere herein.

Another aspect of the present disclosure provides machine executable code that, upon execution by one or more computer processors, implements any of the methods above or elsewhere herein.

Another aspect of the disclosure provides a system for forming a thermoelectric element, comprising: (a) a reaction space having a substrate holder that is configured to hold a substrate; (b) a first vapor source in fluid communication with the reaction space, wherein the first vapor source supplies an oxidizing agent; (c) a second vapor source in fluid communication with the reaction space, wherein the second vapor source supplies a chemical etchant; and (d) a controller having a computer processor that is programmed to execute machine-readable instructions, which when executed by the processor can implement any of the methods provided herein, alone or in combination. In some examples, the machine-readable instruction implement a method comprising (i) contacting an etching layer adjacent to a substrate in the reaction space with the vapor phase oxidizing agent from the first vapor source; and (ii) contacting the etching layer with the chemical etchant from the second vapor source.

Additional aspects and advantages of the present disclosure will become readily apparent to those skilled in this art from the following detailed description, wherein only illustrative embodiments of the present disclosure are shown and described. As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings of which:

DETAILED DESCRIPTION

Figure 1:
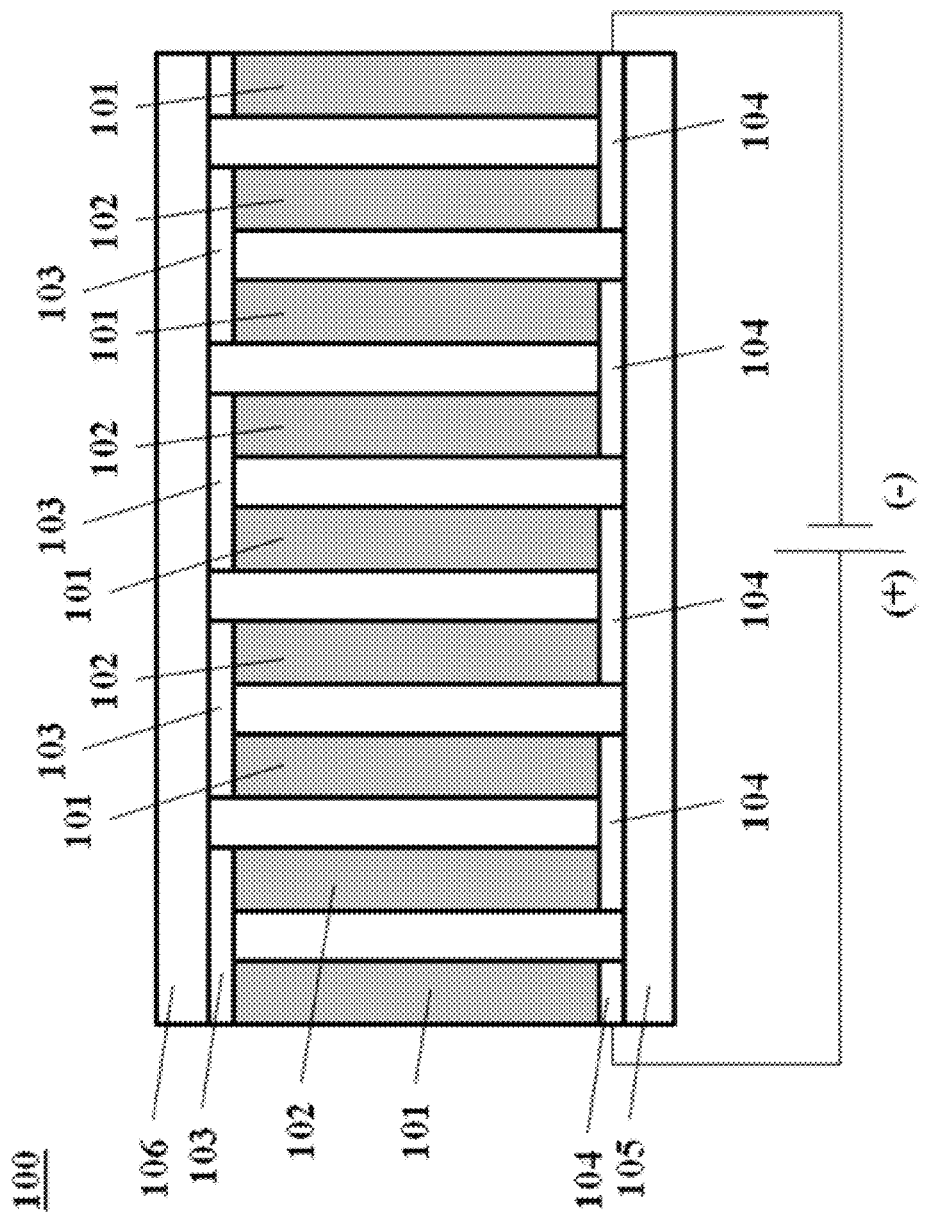
FIG. 1 shows a thermoelectric device.

While various embodiments of the invention have been shown and described herein, it will be obvious to those skilled in the art that such embodiments are provided by way of example only. Numerous variations, changes, and substitutions may occur to those skilled in the art without departing from the invention. It should be understood that various alternatives to the embodiments of the invention described herein may be employed in practicing the invention.

Disclosure of ranges herein includes disclosure of all values and further divided ranges within the entire range, including endpoints given for the ranges.

The term "nanostructure," as used herein, generally refers to structures having a first dimension (e.g., width) along a first axis that is less than about 1 micrometer ("micron") in size. Along a second axis orthogonal to the first axis, such nanostructures can have a second dimension from nanometers or smaller to microns, millimeters or larger. In some cases, the first dimension (e.g., width) is less than about 1000 nanometers ("nm"), or 500 nm, or 100 nm, or 50 nm, or smaller. Nanostructures can include holes formed in a substrate material. The holes can together form a mesh having an array of holes. In other cases, nanostructure can include rod-like structures, such as wires, cylinders or box-like structures. The rod-like structures can have circular, elliptical, triangular, square, rectangular, pentagonal, hexagonal, heptagonal, octagonal or nonagonal, or other cross-sections.

The term "nanohole," as used herein, generally refers to a hole, filled or unfilled, having a width or diameter less than about 1000 nanometers ("nm"), or 500 nm, or 100 nm, or 50 nm, or smaller. A nanohole filled with a metallic, semiconductor, or insulating material can be referred to as a "nanoinclusion."

The term "n-type," as used herein, generally refers to a material that is chemically doped ("doped") with an n-type dopant. For instance, silicon can be doped n-type using phosphorous or arsenic.

The term "p-type," as used herein, generally refers to a material that is doped with an p-type dopant. For instance, silicon can be doped p-type using boron or aluminum.

The term "metallic," as used herein, generally refers to a substance exhibiting metallic properties. A metallic material can include one or more elemental metals.

The term "monodisperse," as used herein, generally refers to features having shapes, sizes (e.g., widths, cross-sections, volumes) or distributions (e.g., nearest neighbor spacing, center-to-center spacing) that are similar to one another. In some examples, monodisperse features (e.g., holes, wires) have shapes or sizes that deviate from one another by at most about 20%, 15%, 10%, 5%, 4%, 3%, 2%, 1%, 0.5%, or 0.1%. In some cases, monodisperse features are substantially monodisperse.

The term "etching material," as used herein, generally refers to a material that facilitates the etching of substrate (e.g., semiconductor substrate) adjacent to the etching material. In some examples, an etching material catalyzes the etching of a substrate upon exposure of the etching material to an oxidizing agent and a chemical etchant. The term "etching layer," as used herein, generally refers to a layer that comprises an etching material.

The term "etch block material," as used herein, generally refers to a material that blocks or otherwise impedes the etching of a substrate adjacent to the etch block material. An etch block material may provide a substrate etch rate that is reduced, or in some cases substantially reduced, in relation to a substrate etch rate associated with an etching material. The term "etch block layer," as used herein, generally refers to a layer that comprises an etch block material.

The term "reaction space," as used herein, generally refers to any environment suitable for the formation of a thermoelectric device or a component of the thermoelectric device. A reaction space can be suitable for the deposition of a material film or thin film adjacent to a substrate, or the measurement of the physical characteristics of the material film or thin film. A reaction space may include a chamber, which may be a chamber in a system having a plurality chambers. The system may include a plurality of fluidically separated (or isolated) chambers. The system may include multiple reactions spaces, with each reaction space being fluidically separated from another reaction space. A reaction space may be suitable for conducting measurements on a substrate or a thin film formed adjacent to the substrate.

The term "adjacent" or "adjacent to," as used herein, includes 'next to', 'adjoining', 'in contact with', and 'in proximity to'. In some instances, adjacent components are separated from one another by one or more intervening layers. The one or more intervening layers may have a thickness less than about 10 micrometers ("microns"), 1 micron, 500 nanometers ("nm"), 100 nm, 50 nm, 10 nm, 1 nm, 0.5 nm or less. For example, a first layer adjacent to a second layer can be in direct contact with the second layer. As another example, a first layer adjacent to a second layer can be separated from the second layer by at least a third layer.

Some embodiments provide thermoelectric devices having thermoelectric elements, each element having an array of nanostructures. Individual thermoelectric elements can be electrically connected to one another. The array of nanostructures is formed by transferring a pattern provided in a template to a substrate adjacent to the template to form a thermoelectric element having the array of nanostructures. The array of nanostructures can include a plurality of holes (e.g., nanoholes) or elongate structures, such as wires (e.g., nanowires).

Thermoelectric Devices

The present disclosure provides thermoelectric devices that can be employed for use in various applications, such as heating and/or cooling applications, or power generation. Thermoelectric devices of the present disclosure have various non-limiting advantages and benefits, such as substantially high aspect ratios, uniformity of holes or wires, and figure-of-merit, ZT, that can be suitable for optimum thermoelectric device performance. With respect to the figure-of-merit, Z can be an indicator of coefficient-of-performance (COP) and the efficiency of a thermoelectric device, and T can be an average temperature of the hot and the cold sides of the thermoelectric device. In some embodiments, the figure-of-merit (ZT) of a thermoelectric element or thermoelectric device is at least about 0.01, 0.1, 0.2, 0.3, 0.4, 0.5, 0.6, 0.7, 0.8, 0.9, 1.0, 1.1, 1.2, 1.3, 1.4, 1.5, 1.6, 1.7, 1.8, 1.9, 2.0, 2.1, 2.2, 2.3, 2.4, 2.5, 2.6, 2.7, 2.8, 2.9, or 3.0. In some case, the figure-of-merit is between about 0.01 and 3, or 0.1 and 2.5, or 0.5 and 2.0.

FIG. 1 shows a thermoelectric device 100, in accordance with an embodiment of the present disclosure. The thermoelectric device 100 includes n-type 101 and p-type 102 thermoelectric elements (also "elements" herein) disposed between a first set of electrodes 103 and a second set of electrodes 104 of the thermoelectric device 100. The first set of electrodes 103 connect adjacent n-type 101 and p-type elements, as illustrated.

The electrodes 103 and 104 are in contact with a hot side material 105 and a cold side material 106 respectively. In some embodiments, the hot side material 105 and cold side material 106 are electrically insulating but thermally conductive. The application of an electrical potential to the electrodes 103 and 104 leads to the flow of current, which generates a temperature gradient ($\Delta$T) across the thermoelectric device 100. The temperature gradient (□T) extends from a first temperature (average), T1, at the hot side material 105 to a second temperature (average), T2, at the cold side material 106, where T1>T2. The temperature gradient can be used for heating and cooling purposes.

The n-type 101 and p-type 102 elements of the thermoelectric device 100 can comprise or be formed of nanostructures. In some situations, the nanostructures are holes or inclusions, which can be provided in an array of holes (e.g., mesh). In other situations, the nanostructures are rod-like structures, such as nanowires. In some cases, the rod-like structures are laterally separated from one another.

In some cases, the n-type 101 and/or p-type 102 elements are formed of an array of wires or holes oriented along the direction of the temperature gradient. That is, the wires extend from the first set of electrodes 103 to the second set of electrodes 104. In other cases, the n-type 101 and/or p-type 102 elements are formed of an array of holes oriented along a direction that is angled between about 0° and 90° in relation to the temperature gradient. In an example, the array of holes is orthogonal to the temperature gradient.

Figure 2:
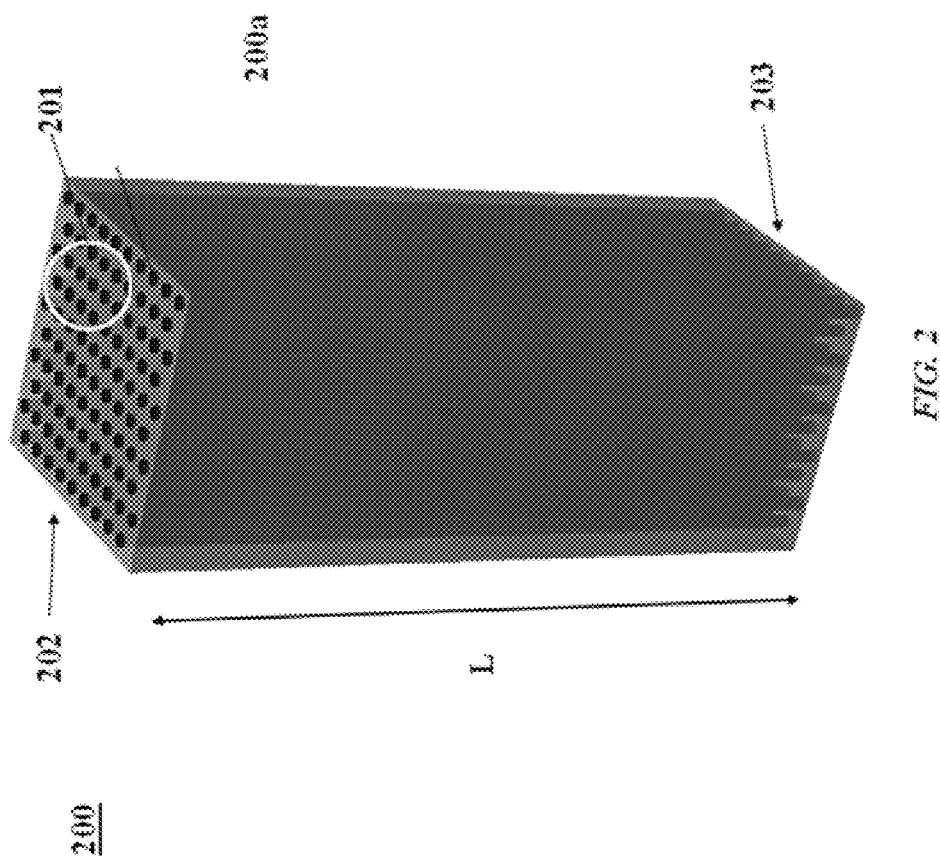
FIG. 2 is a schematic perspective view of a thermoelectric element, in accordance with an embodiment of the present disclosure.
Figure 3:
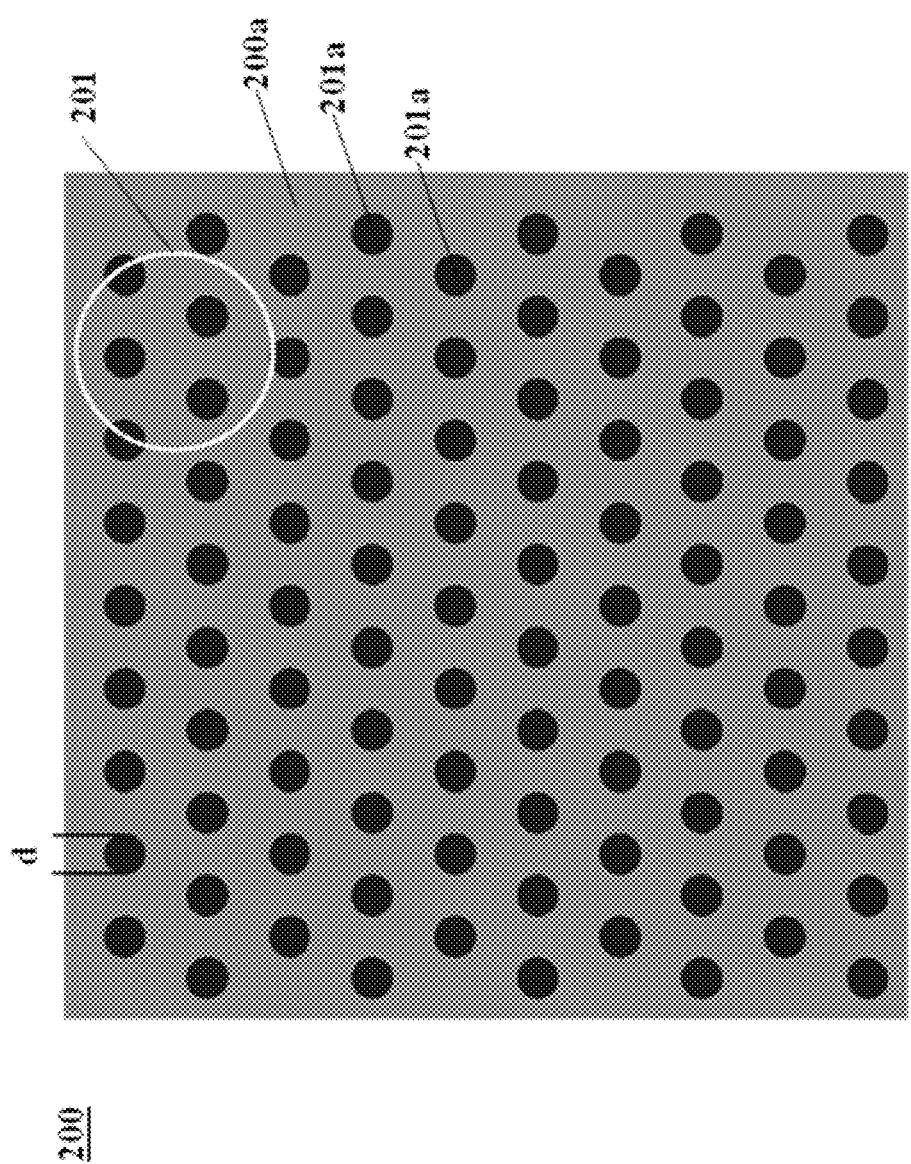
FIG. 3 is a schematic top view of the thermoelectric element of FIG. 2, in accordance with an embodiment of the present disclosure.
Figure 4:
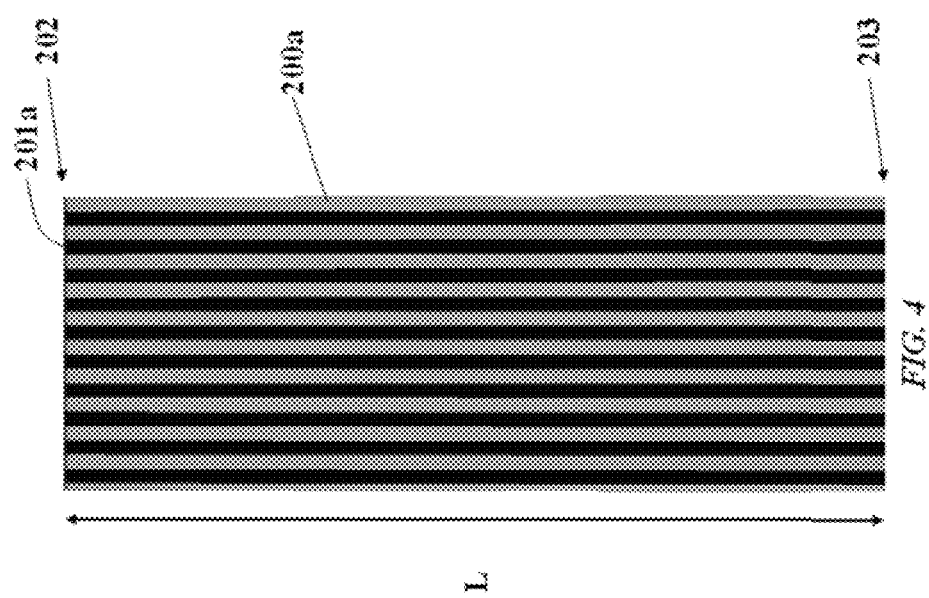
FIG. 4 is a schematic side view of the thermoelectric element of FIGS. 2 and 3, in accordance with an embodiment of the present disclosure.

FIG. 2 is a schematic perspective view of a thermoelectric element 200 having an array of holes 201 (select holes circled), in accordance with an embodiment of the present disclosure. The array of holes can be referred to as a "nanomesh" herein. FIGS. 3 and 4 are perspective top and side views of the thermoelectric element 200. The element 200 can be an n-type or p-type element, as described elsewhere herein. The array of holes 201 includes individual holes 201a that can have widths from several nanometers or less up to microns, millimeters or more. In some embodiments, the holes have widths (or diameters, if circular) ("d") between about 1 nm and 500 nm, or 5 nm and 100 nm, or 10 nm and 30 nm. The holes can have lengths ("L") from about several nanometers or less up to microns, millimeters or more. In some embodiments, the holes have lengths between about 0.5 microns and 1 centimeter, or 1 micron and 500 millimeters, or 10 microns and 1 millimeter.

The holes 201a are formed in a substrate 200a. In some cases, the substrate 200a is a solid state material, such as e.g., carbon, silicon, germanium, gallium arsenide, aluminum gallium arsenide, silicides, silicon germanium, bismuth telluride, lead telluride, oxides (e.g., $SiO_x$, where 'x' is a number greater than zero), gallium nitride and tellurium silver germanium antimony (TAGS) containing alloys. The substrate 200a may be formed of a semiconductor material comprising one or more semiconductors. The semiconductor material can be doped n-type or p-type for n-type or p-type elements, respectively.

In some cases, the holes 201a are filled with a gas, such as He, Ne, Ar, $N_2$, $H_2$, $CO_2$, $O_2$, or a combination thereof. In other cases, the holes 201a are under vacuum. Alternatively, the holes may be filled (e.g., partially filled or completely filled) with a semiconductor material, an insulating (or dielectric) material, or a gas (e.g., He, Ar, $H_2$, $N_2$, $CO_2$).

A first end 202 and second end 203 of the element 200 can be in contact with a substrate having a semiconductor-containing material, such as silicon or a silicide. The substrate can aid in providing an electrical contact to an electrode on each end 202 and 203. Alternatively, the substrate can be precluded, and the first end 202 and second end 203 can be in contact with a first electrode (not shown) and a second electrode (not shown), respectively.

In some embodiments, the holes 201a are substantially monodisperse. Monodisperse holes may have substantially the same size, shape and/or distribution (e.g., cross-sectional distribution). In other embodiments, the holes 201a are distributed in domains of holes of various sizes, such that the holes 201a are not necessarily monodisperse. For example, the holes 201a may be polydisperse. In some situations, the device 200 includes a first set of holes with a first diameter and a second set of holes with a second diameter. The first diameter is larger than the second diameter. In other cases, the device 200 includes two or more sets of holes with different diameters.

The holes 201a can have various packing arrangements. In some cases, the holes 201a, when viewed from the top (see FIG. 3), have a hexagonal close-packing arrangement.

In some embodiments, the holes 201a in the array of holes 201 have a center-to-center spacing between about 1 nm and 500 nm, or 5 nm and 100 nm, or 10 nm and 30 nm. In some cases, the center-to-center spacing is the same, which may be the case for monodisperse holes 201a. In other cases, the center-to-center spacing can be different for groups of holes with various diameters and/or arrangements.

The dimensions (lengths, widths) and packing arrangement of the holes 201, and the material and doping configuration (e.g., doping concentration) of the element 200 can be selected to effect a predetermined electrical conductivity and thermal conductivity of the element 200, and a thermoelectric device having the element 200. For instance, the diameters and packing configuration of the holes 201 can be selected to minimize the thermal conductivity, and the doping concentration can be selected to maximize the electrical conductivity of the element 200.

The array of holes 201 can have an aspect ratio (e.g., the length of the element 200 divided by width of an individual hole 201a) of at least about 1.5:1, or 2:1, or 5:1, or 10:1, or 20:1, or 50:1, or 100:1, or 1000:1, or 5,000:1, or 10,000:1, or 100,000:1, or 1,000,000:1, or 10,000,000:1, or 100,000,000:1, or more.

In some embodiments, thermoelectric elements can include an array of wires. The array of wires can include individual wires that are, for example, rod-like structures.

Figure 5:
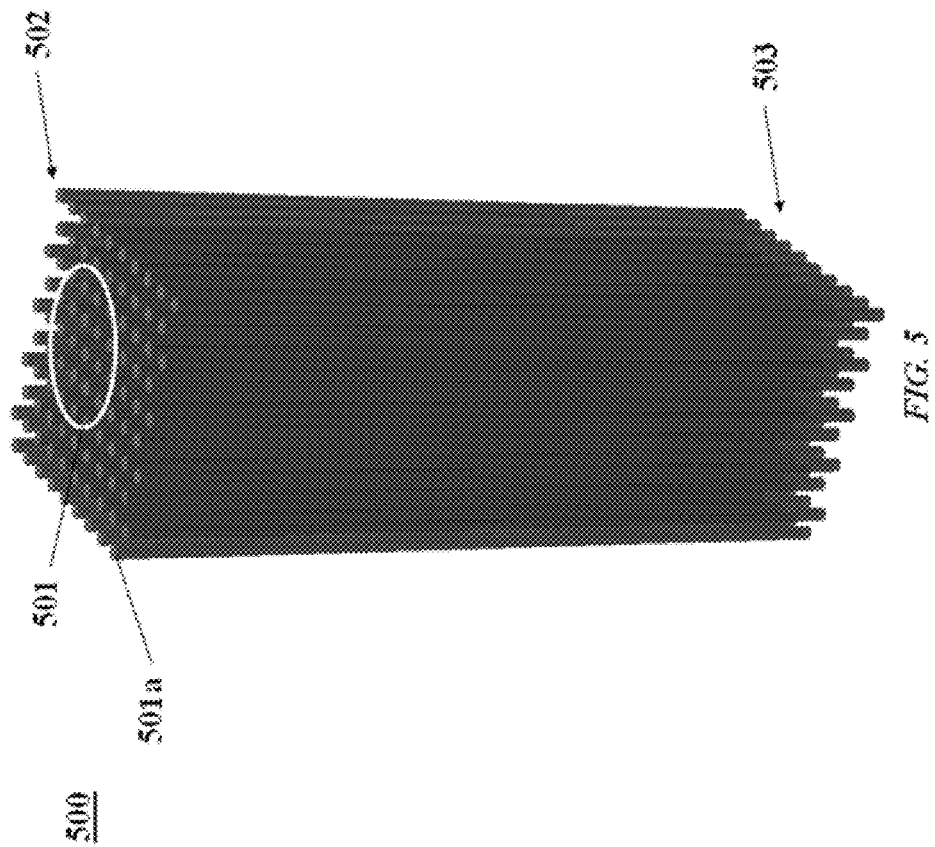
FIG. 5 is a schematic perspective top view of a thermoelectric element, in accordance with an embodiment of the present disclosure.
Figure 6:
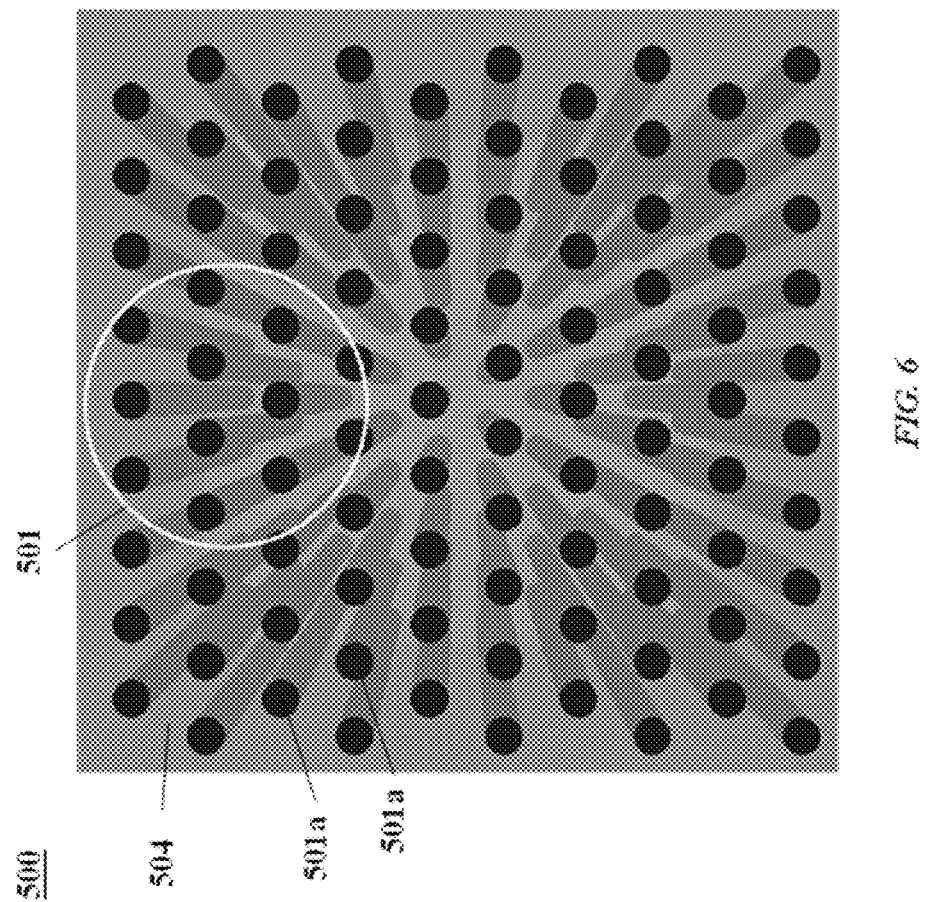
FIG. 6 is a schematic perspective top view of the thermoelectric element of FIG. 5, in accordance with an embodiment of the present disclosure.

FIG. 5 is a schematic perspective top view of a thermoelectric element 500, in accordance with an embodiment of the present disclosure. FIG. 6 is a schematic perspective top view of the thermoelectric element 500. The thermoelectric element 500 may be used with devices, systems and methods provided herein. The element 500 includes an array of wires 501 having individual wires 501a. In some embodiments, the wires have widths (or diameters, if circular) ("d") between about 1 nm and 500 nm, or 5 nm and 100 nm, or 10 nm and 30 nm. The wires can have lengths ("L") from about several nanometers or less up to microns, millimeters or more. In some embodiments, the wires have lengths between about 0.5 microns and 1 centimeter, or 1 micron and 500 millimeters, or 10 microns and 1 millimeter.

In some embodiments, the wires 501a are substantially monodisperse. Monodisperse wires may have substantially the same size, shape and/or distribution (e.g., cross-sectional distribution). In other embodiments, the wires 501a are distributed in domains of wires of various sizes, such that the wires 501a are not necessarily monodisperse. For example, the wires 501a may be polydisperse.

In some embodiments, the wires 501a in the array of wires 501 have a center-to-center spacing between about 1 nm and 500 nm, or 5 nm and 100 nm, or 10 nm and 30 nm. In some cases, the center-to-center spacing is the same, which may be the case for monodisperse wires 501. In other cases, the center-to-center spacing can be different for groups of wires with various diameters and/or arrangements.

In some embodiments, the wires 501a are formed of a semiconductor material, such as, e.g., silicon, germanium, gallium arsenide, aluminum gallium arsenide, silicide alloys, alloys of silicon germanium, bismuth telluride, lead telluride, oxides (e.g., $SiO_x$, where 'x' is a number greater than zero), gallium nitride and tellurium silver germanium antimony (TAGS) containing alloys. The wires 501a can be doped with an n-type dopant or a p-type dopant.

In some embodiments, the wires 501a are attached to semiconductor substrates at a first end 502 and second end 503 of the element 500. The semiconductor substrates can have the n-type or p-type doping configuration of the individual wires 501a. In other embodiments, the wires 501a at the first end 502 and second end 503 are not attached to semiconductor substrates, but can be attached to electrodes. For instance, a first electrode (not shown) can be in electrical contact with the first end 502 and a second electrode can be electrical contact with the second end 503.

With reference to FIG. 6, space 504 between the wires 501a may be filled with a vacuum or various materials. In some embodiments, the wires are laterally separated from one another by an electrically insulating material, such as a silicon dioxide, germanium dioxide, gallium arsenic oxide, spin on glass, and other insulators deposited using, for example, vapor phase deposition, such as chemical vapor deposition or atomic layer deposition. In other embodiments, the wires are laterally separated from one another by vacuum or a gas, such as He, Ne, Ar, $N_2$, $H_2$, $CO_2$, $O_2$, or a combination thereof.

The array of wires 501 can have an aspect ratio—length of the element 500 divided by width of an individual wire 501a—of at least about 1.5:1, or 2:1, or 5:1, or 10:1, or 20:1, or 50:1, or 100:1, or 1000:1, or 5,000:1, or 10,000:1, or 100,000:1, or 1,000,000:1, or 10,000,000:1, or 100,000,000:1, or more. In some cases, the length of the element 500 and the length of an individual wire 501a are substantially the same.

Thermoelectric elements provided herein can be incorporated in thermoelectric devices for use in cooling and/or heating and, in some cases, power generation. In some examples, the device 100 may be used as a power generation device. In an example, the device 100 is used for power generation by providing a temperature gradient across the electrodes and the thermoelectric elements of the device 100.

Figure 7:
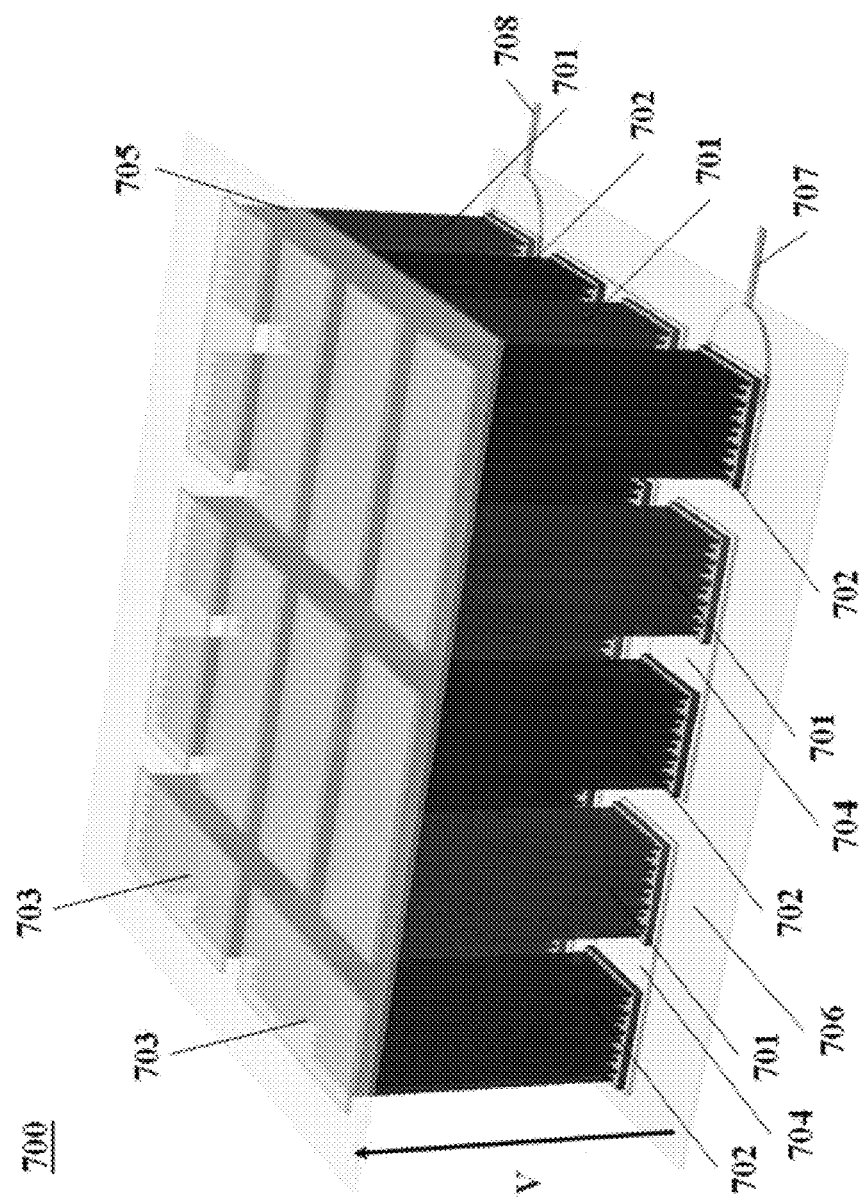
FIG. 7 is a schematic perspective view of a thermoelectric device comprising elements having an array of wires, in accordance with an embodiment of the present disclosure.

FIG. 7 shows a thermoelectric device 700 having n-type elements 701 and p-type elements 702, in accordance with an embodiment of the present disclosure. The n-type elements 701 and p-type elements 702 each include an array of wires, such as nanowires. An array of wires can include a plurality of wires. The n-type elements 701 include n-type (or n-doped) wires and the p-type elements 702 include p-type wires. The wires can be nanowires or other rod-like structures.

Adjacent n-type elements 701 and p-type elements 702 are electrically connected to one another at their ends using electrodes 703 and 704. The device 700 includes a first thermally conductive, electrically insulating layer 705 and a second thermally conductive, electrically insulating layer 706 at opposite ends of the elements 701 and 702.

The device 700 includes terminals 707 and 708 that are in electrical communication with the electrodes 703 and 704. The application of an electrical potential across the terminals 707 and 708 generates a flow of electrons and holes in the n-type and p-type elements 701 and 702, respectively, which generates a temperature gradient across the elements 701 and 702. The first thermally conductive, electrically insulating layer 705 is a cold side of the device 700; the second thermally conductive, electrically insulating layer 706 is a hot side of the device 700. The cold side is cooler (i.e., has a lower operating temperature) than the hot side.

Figure 8:
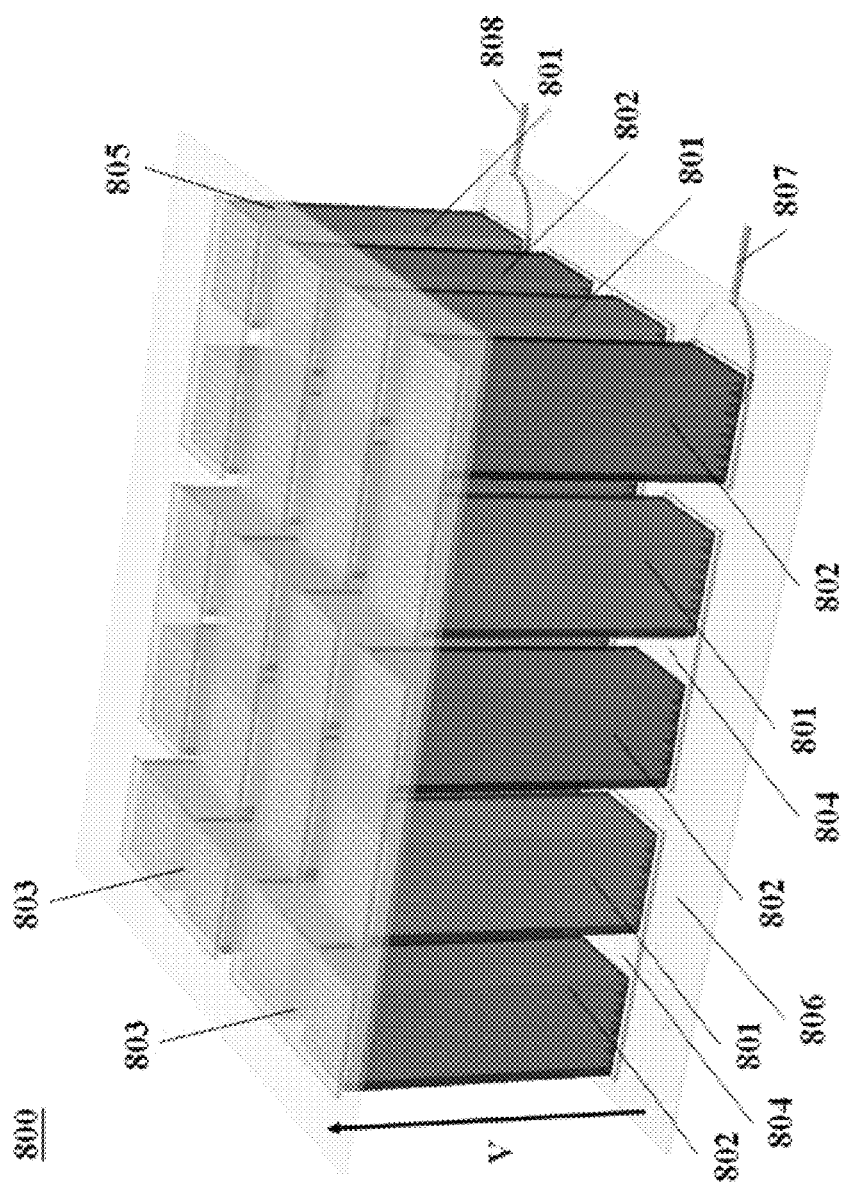
FIG. 8 is a schematic perspective view of a thermoelectric device comprising elements having an array of holes, in accordance with an embodiment of the present disclosure.

FIG. 8 shows a thermoelectric device 800 having n-type elements 801 and p-type elements 802, in accordance with an embodiment of the present disclosure. The n-type elements 801 and p-type elements 802 are formed in n-type and p-type semiconductor substrates, respectively. Each substrate can include an array of holes, such as nanoholes. The array of holes each include a plurality of holes. An individual hole can span the length of an n-type or p-type element. The holes can be monodisperse, in which case hole dimensions and center-to-center spacing may be substantially constant. In some cases, the array of holes includes holes with center-to-center spacing and hole dimensions (e.g., widths or diameters) that may be different. In such a case, the holes may not be monodisperse.

Select n-type elements 801 and p-type elements 802 are electrically connected to one another at their ends by electrodes 803 and 804. The device 800 includes a first thermally conductive, electrically insulating layer ("first layer") 805 and a second thermally conductive, electrically insulating layer ("second layer") 806 at opposite ends of the elements 801 and 802.

The device 800 includes terminals 807 and 808 that are in electrical communication with the electrodes 803 and 804. The application of an electrical potential across the terminals 807 and 808 generates the flow of electrons and holes in the n-type and p-type elements 801 and 802, respectively, which generates a temperature gradient across the elements 801 and 802. The first thermally conductive, electrically insulating layer 805 is a cold side of the device 800; the second thermally conductive, electrically insulating layer 806 is a hot side of the device 800. The cold side is cooler (i.e., has a lower operating temperature) than the hot side.

The thermoelectric device 800 has a temperature gradient from the second thermally conductive, electrically insulating layer 806 to the first thermally conductive, electrically insulating layer 805. In some cases, the holes are disposed parallel to a vector oriented from the first layer 805 to the second layer 806. In other cases, the holes are disposed at an angle greater than 0° in relation to the vector. For instance, the holes can be disposed at an angle of at least about 1°, 10°, 20°, 30°, 40°, 50°, 60°, 70°, 80°, or 90° in relation to the vector.

Figure 9:
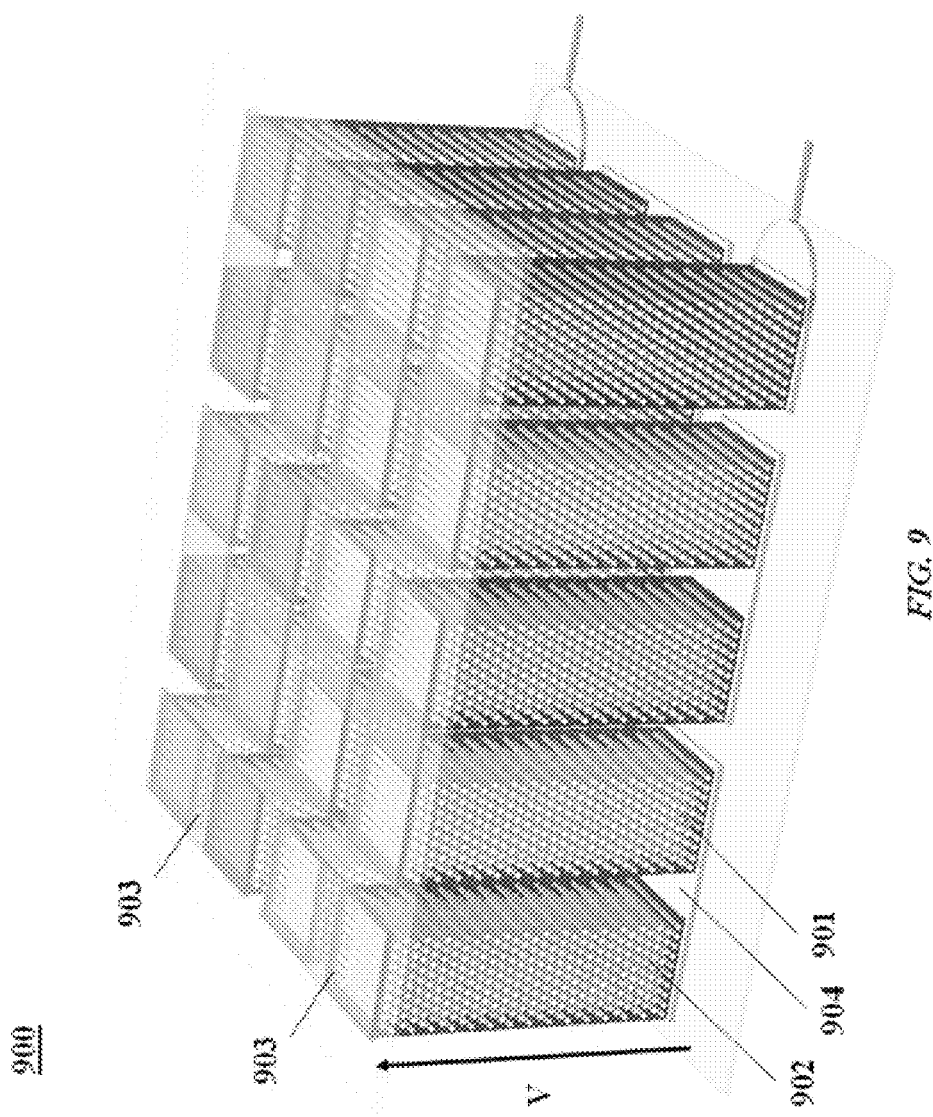
FIG. 9 is a schematic perspective view of a thermoelectric device comprising elements having an array of holes that are oriented perpendicularly with respect to the vector V, in accordance with an embodiment of the present disclosure.

FIG. 9 shows a thermoelectric device 900 having n-type elements 901 and p-type elements 902, with the elements having holes formed in substrates of the n-type and p-type elements. The holes are oriented perpendicular to a vector ("V") orthogonal to the electrodes 903 and 904 of the device 900.

Wires or holes of thermoelectric elements provided herein may be formed in a substrate and oriented substantially anti-parallel to a support structure, such as an electrode. In some examples, the wires or holes are oriented at an angle greater than 0°, or 10°, or 20°, or 30°, or 40°, or 50°, or 60°, or 70°, or 80°, or 85° in relation to the support structure. In an example, the wires or holes are oriented at an angle of about 90° in relation to the support structure. The electrode may be an electrode of a thermoelectric device. In some cases, wires or holes may be oriented substantially parallel to the electrode.

Methods for Forming Thermoelectric Devices

Another aspect of the present disclosure provides methods for forming holes in or wires from a substrate. In some cases, the methods comprise defining, with the aid of a metallic material, a pattern to be transferred to a substrate, and catalytically etching the substrate to define the pattern in the substrate.

A thermoelectric device having a plurality of holes or wires can be formed by initially forming a mask (or template) adjacent to a substrate. The mask can comprise a polymer matrix having three-dimensional structures distributed or otherwise provided therein. In some examples, the three-dimensional structures are phase-separated in the polymer matrix. In some examples, three-dimensional structures phase-separated in the polymer matrix are immiscible in the polymer matrix. The three-dimensional structures may agglomerate (or coalesce) in the polymer matrix. The three-dimensional structures may be formed of a polymeric material that is different from the material comprising the polymer matrix. In some cases, the three-dimensional structures are formed of a block copolymer. The three-dimensional structures may each be formed of a block copolymer. An individual three-dimensional structure, in some examples, includes three-dimensional rods or cylinders. The rods or cylinders can extend through the mask.

Next, the three-dimensional structures are removed to provide a plurality of holes exposing portions of the substrate. Exposed portions of the substrate can directly expose the substrate to a reaction space, or expose one or more intervening layers between the substrate and the reaction space, such as, for example, an oxide of the material comprising the substrate (e.g., native oxide). In some cases, the three-dimensional structures are removed by selectively etching the three dimensional structures in relation to the polymer matrix. The plurality of holes defined a pattern. Next, an etching layer is deposited adjacent to the mask and exposed portions of the substrate. The etching layer comprises an etching material that facilitates etching of the substrate. The etching layer can be deposited using any vapor phase deposition technique, such as, for example, physical vapor deposition (PVD) (e.g., sputtering, evaporation, electron-beam evaporation), chemical vapor deposition (CVD) or atomic layer deposition (ALD). The mask is then removed to leave the etching layer. The etching layer may include particles (e.g., metallic particles) of the etching material adjacent to the substrate. The particles may be distributed in accordance with the pattern. The etching layer is then exposed to an oxidizing agent and a chemical etchant (also "etchant" herein) to form holes in the substrate. The oxidizing agent, chemical etchant or both may be brought in contact with the etching layer in the gas phase. The oxidizing agent can include one or more oxidizing chemicals. In some cases, the etching layer is exposed to an oxidizing agent, chemical etchant and water (e.g., water vapor). The holes may have shapes, sizes and distributions as described elsewhere herein. The holes, in some cases, have dimensions on the order of nanometers to micrometers. In some cases, the holes are nanoholes or nanoinclusions. The holes may define a nanomesh.

In some cases, particles of an etching layer can be deposited on or adjacent to a substrate using a vapor deposition technique, such as PVD, without the use of a mask. The particles may be distributed randomly over the substrate surface, or the distribution of particles may be controlled to provide an ordered distribution of particles by controlling the deposition temperature and/or pressure. The particles can include a metallic material that can catalyze substrate etching when exposed to a chemical etchant (e.g., HF) and an oxidizing agent (e.g., $H_2O_2$). In some examples, a sufficiently thin layer of a catalyst material is deposited on or adjacent to the substrate such that the catalyst material breaks up or self-assembles into small islands and clusters under ambient conditions (e.g., temperature of about 298 K) or under annealing at an elevated temperature (e.g., temperature greater than or equal to about 300 K, 400 K, 500 K, or 600 K). The mean particle diameters and shapes, and particle distributions, can be controlled with the deposition or annealing conditions, such as annealing temperature and pressure. Another example of a mask-free approach involves depositing the catalyst metal particles as colloidal particles (e.g. dip-coating, spray-coating, drop-casting) that can be prepared with substantially precise control over the composition, size, shape, surface charge and inter-particle distance. Additionally, certain particle preparations with carefully controlled surface charge can enable layer-by-layer deposition and precise control over the surface coverage and thickness of the deposited metal particle film. These particles can have capping surface ligands or layers that can aid in preventing uncontrolled particle agglomeration. The capping surface ligands or layers can be removed by annealing or plasma cleaning steps before exposing the catalyst particles to an etchant mixture comprising a chemical etchant and an oxidizing agent, as described elsewhere herein.

As an alternative, the pattern may be inverted to form wires in the substrate. In some examples, prior to depositing the etching layer, an etch block layer is deposited on portions of the substrate exposed through the holes in the mask. The etch block layer can be deposited with the aid of a vapor phase deposition technique, such as CVD. The etch block layer can include an etch block material that does not appreciably etch the substrate or, in some cases, etches the substrate at an etch rate that is lower, or substantially reduced, in relation to the rate at which the etching material etches the substrate. In some examples, the etch block layer prevents the etching of the substrate. Next, the polymer matrix is removed to expose portion of the substrate. The exposed portions of the substrate may have one or more intervening layers thereon, such as, for example, a layer of an oxide (e.g., oxide of the substrate).

Next, the etching layer is deposited on exposed portions of the substrate. The etching layer may also be deposited on the etch block layer. Portions of the etching layer may be at least partially aligned with the etch block layer (or vice versa). In some examples, the etch block layer may then be removed along with the overlying etching layer, such as with the aid of an etching chemistry that is selective to the etch block layer. The etching chemistry may be a vapor phase etching chemistry. Next, the etching layer is exposed to an oxidizing agent and an etchant to form wires from the substrate. The oxidizing agent and the etchant may be provided in the gas phase. The oxidizing agent can include one or more oxidizing chemicals. In some cases, the etching layer is exposed to an oxidizing agent, chemical etchant and water (e.g., water vapor). The etching material can serve as a catalyst to form the wires. The wires may be cylindrical. In some case, the wires have widths (or diameters) on the order of nanometers to micrometers. The wires may be nanowires.

The etching layer can include a metallic material having one or more elemental metals. For instance, the etching layer can include a metallic material having one or more metals selected from gold, silver, platinum, chromium, molybdenum, tungsten, osmium, iridium, rhodium, ruthenium, palladium, copper, nickel and other metals (e.g., noble metals), and any combinations thereof. In some examples, the etching material can be selected from gold, silver, platinum, palladium, and other noble metals. In other examples, the etching material can include a non-noble metal that can catalyze the decomposition of a chemical oxidant, such as, for example, copper, nickel, or combinations thereof. As discussed elsewhere herein, in certain embodiments, the etching layer can include a metallic material that may comprise any combination or alloy of gold, silver, platinum, chromium, molybdenum, tungsten, palladium, and/or other noble metals.

In some embodiments, the etching material facilitates the etching of the semiconductor substrate. For instance, the etching material can catalytically facilitate the etching of the semiconductor substrate (see, e.g., FIGS. 11 and 12). Etching of the semiconductor substrate can be anisotropic, having an etch rate along an axis orthogonal to a surface of the substrate that is greater than an etch rate along an axis parallel to the surface of the substrate. In some examples, the etching material may catalyze the oxidation of a semiconductor substrate to an oxide of the semiconductor (e.g., $SiO_2$).

In some examples, a substrate comprising an etching layer is placed in an etching chamber and an etchant mixture is exposed to the substrate at a composition (e.g., partial pressure), pressure and/or temperature that can be selected to induce substrate etching. The etching layer can comprise a pattern of catalyst particles. The composition (e.g., partial pressure), pressure and/or temperature of the etching chamber and/or the etchant mixture can be selected such that the etch rate of the substrate is at least about 0.1 nanometers (nm)/second (s), 0.5 nm/s, 1 nm/s, 2 nm/s, 3 nm/s, 4 nm/s, 5 nm/s, 6 nm/s, 7 nm/s, 8 nm/s, 9 nm/s, 10 nm/s, 20 nm/s, 30 nm/s, 40 nm/s, 50 nm/s, 100 nm/s, 1000 nm/s, or 10,000 nm/s. The etchant mixture can be supplied in the gas phase. As an alternative, the etchant mixture can be supplied in the supercritical phase (or as a supercritical fluid). The etchant mixture can comprise a chemical etchant (e.g., hydrogen fluoride, hydrogen chloride, hydrogen bromide, hydrogen iodide), an oxidizing agent (e.g., hydrogen peroxide, oxygen), and a diluents (e.g. helium, argon, nitrogen, carbon monoxide, water vapor, ethanol).

The etching layer may facilitate the etching of the substrate at a rate that is higher than the rate at which the etch block layer etches the substrate (e.g., semiconductor substrate). In some cases, there is substantially little or no appreciable etching of portions of the substrate that are adjacent to etch block material upon, for example, exposure of the etch block material to an oxidizing agent and an etchant.

In some embodiments, etch block material can be selected from elemental metals, metalloids, non-metals, polymers, and combinations thereof. Examples of elemental metals for use as etch block material layer include, without limitation, chromium, molybdenum, tungsten, titanium, niobium, and combinations thereof. Non-metals may for use as etch block material include carbon, semiconductors (e.g., silicon, germanium, gallium arsenide), composite materials, derivatives thereof (e.g., oxides, nitrides), or combinations thereof. Examples of non-metals include, without limitation, silicon dioxide, silicon nitride, silicon carbide, gallium oxide, gallium nitride, gallium arsenide, derivatives thereof (e.g., silicides) and combinations thereof. Examples of metalloids for use as etch block material include, without limitation, boron, silicon, germanium, arsenic, antimony, tellurium and combinations thereof. Examples of polymers for use as etch block material include, without limitation, polyimide, polycarbonate, polyethylene, polypropylene, and combinations thereof.

The etch block material of the etch block layer and the etching material of the etching layer can be selected such that, upon exposure of the etch block layer and the etching layer to an oxidizing agent and a chemical etchant, the etching layer facilitates the etching of the semiconductor substrate at a rate (substrate etch rate) that is higher in relation to the substrate etch rate of the etch block layer. In some examples, a ratio of etching rates of portions of the substrate adjacent to the etching layer in relation to portions of the substrate adjacent to the etch block layer is at least about 1:2:1, 1.3:1, 1.4:1, 1:5:1, 2:1, 3:1, 4:1, 5:1, 10:1, 100:1, 500:1, 1000:1, 10,000:1, 100,000:1, 1,000,000:1.

In some embodiments, a method for forming a thermoelectric device having a plurality of holes or wires comprises forming a mask (or template) adjacent to a substrate, the mask having three-dimensional structures in a polymer matrix. The three-dimensional structures may be phase-separated in the polymer matrix. In some cases, the three-dimensional structures are formed of a block copolymer. The three-dimensional structures may each be formed of a block copolymer. Next, the polymer matrix is removed (e.g., by etching the polymer matrix in relation to the three-dimensional structures), thereby exposing portions of the substrate and providing a plurality of free-standing three-dimensional structures adjacent to the substrate. The matrix may be removed with the aid of an etching chemistry that is selective to the polymer matrix—e.g., a chemistry that provides an etch rate of the polymer matrix that is greater than the etch rate of the three-dimensional structures. The plurality of free-standing three-dimensional structures of the mask may define a pattern for transfer to the substrate. An etching layer is then deposited adjacent to the mask and exposed portions of the substrate. As described elsewhere herein, exposed portions of the substrate can directly expose the substrate to a reaction space, or expose one or more intervening layers between the substrate and the reaction space, such as, for example, an oxide of the material comprising the substrate (e.g., native oxide). The free-standing three-dimensional structures are then removed and the etching layer is exposed to an oxidizing agent and an etchant to form wires from the substrate. The material of the etching layer may serve as a catalyst to form the wires. The wires may be cylindrical. In some case, the wires have widths (or diameters) on the order of nanometers to micrometers. The wires may be nanowires.

As an alternative, the pattern may be inverted to form holes in the substrate. In some examples, prior to depositing the etching layer, an etch block layer is deposited adjacent to the substrate and the free-standing three-dimensional structures. The etch block layer is formed of an etch block material that etches the substrate at an etch rate that is lower or substantially reduced in relation to the rate at which the etching material of the etching layer etches the substrate. In some cases, the etch block layer prevents the etching of the substrate. Next, the free-standing three-dimensional structures are removed to expose portion of the substrate. The free-standing three-dimensional structures may be removed with the aid of chemical etching and/or mechanical etching, such as, for example, chemical mechanical polishing or planarization (CMP). The exposed portions of the substrate may have a layer of an oxide formed thereon, such as a native oxide. The etching layer is then deposited on exposed portions of the substrate. The etching layer may also be deposited on the etch block layer. Next, the etching layer is exposed to an oxidizing agent and an etchant to form holes in the substrate. The material of the etching layer may serve as a catalyst to form the holes. The holes may be cylindrical. In some case, the holes have widths (or diameters) on the order of nanometers to micrometers. The holes may be nanoholes.

In some situations, the template (or mask) is formed of a first polymeric material and the three-dimensional structures defining the pattern are formed of a second polymeric material. The second polymeric material is embedded in a matrix comprised of the first polymeric material.

The first polymeric material can be formed of a material having a molecular weight of at least about 1 kilodalton (kDa), or 2 kDa, or 3 kDa, or 4 kDa, or 5 kDa, or 6 kDa, or 7 kDa, or 8 kDa, or 9 kDa, or 10 kDa, or 20 kDa, or 30 kDa, or 40 kDa, or 50 kDa, or 100 kDa, or 200 kDa, or more. In some situations, the first polymeric material has a molecular weight between about 10 kDa and 80 kDa, or 20 kDa and 60 kDa, or 30 kDa and 50 kDa. In some embodiments, the first polymeric material is polystyrene.

The second polymeric material can be formed of a material having a molecular weight of at least about 1 kDa, or 2 kDa, or 3 kDa, or 4 kDa, or 5 kDa, or 6 kDa, or 7 kDa, or 8 kDa, or 9 kDa, or 10 kDa, or 20 kDa, or 30 kDa, or 40 kDa, or 50 kDa, or 100 kDa, or more. In some situations, the second polymeric material has a molecular weight between about 5 kDa and 40 kDa, or 10 kDa and 30 kDa, or 15 kDa and 25 kDa. In some embodiments, the second polymeric material is a block copolymer. In some cases, the second polymeric material can be selected from poly(methyl methacrylate) (PMMA), poly(styrene-b-dimethylsiloxane) (PS-b-PDMS), poly(styrene-b-ethylene oxide) (PS-b-PEO), poly(styrene-b-4-vinylpyridine) (PS-b-P4VP), poly(styrene-block-2-vinylpyridine) (PS-b-P2VP), or mixtures thereof.

The second polymeric material can be removed with the aid of an etching chemistry that may be selected based on the material comprising the second polymeric material and, in some cases, the first polymeric material. For example, a second polymeric material formed of PS-b-PDMS can be etched using hydrogen fluoride. As another example, a second polymeric material formed of PS-b-PEO can be etched using hydrogen iodide. PMMA can be etched using acetic acid. Etching chemistries for various polymeric materials can be found at, for example, Silverstein, M. S., Cameron, N. R., & Hillmyer, M. A. (2011), *Porous Polymers*, New Jersey: John Wiley & Sons, Inc. which is entirely incorporated herein by reference.

The template can be used to form a pattern of holes or rod-like structures. An array of holes can be formed in the substrate by providing a metallic material in the holes of the template to define an array of particles (e.g., nanoparticles) adjacent to the substrate. With the aid of the metallic material, the substrate can be etched to form a thermoelectric element having an array of holes. Alternatively, an array of rod-like structure can be formed from the substrate by etching, with the aid of a metallic material, the substrate relative to metallic particles adjacent to the substrate to form a thermoelectric element having an array of rods (or wires).

In some embodiments, thermoelectric elements are formed by providing a template adjacent to a substrate, such as a semiconductor (e.g., silicon) substrate. The template can be formed of a polymeric material, such as a copolymer (e.g., block copolymer). In an example, a template is formed by providing a block copolymer and forming an array of cylinders in the block copolymer to define the template.

In some situations, a template (or mask) is formed by providing a polymeric mixture having a first polymeric material and a second polymeric material, and spin coating the polymeric mixture over a semiconductor substrate. Upon spin coating and thermal annealing, the second polymeric mixture phase separates into domains of three-dimensional structures (e.g., cylindrical structures) that define a pattern in the template. Such phase separation can include the three-dimensional structures agglomerating into domains. The three-dimensional structures are disposed in a polymeric matrix having the first polymeric material. Next, to form an array of holes (see, e.g., FIG. 2) in the substrate, the three-dimensional structures can be etched to reveal the substrate, and the array of holes can be catalytically transferred to the substrate to provide an array of holes (or inclusions) in the substrate.

Alternatively, to form an array of wires (or rods) from the substrate (see, e.g., FIG. 5), the polymeric matrix can be etched to provide an array of three-dimensional structures over the substrate. A pattern defined by the array of three-dimensional structures can then be catalytically transferred to the substrate to provide an array of wires formed from the substrate.

As another alternative, to form an array of wires (or rods) from the substrate (see, e.g., FIG. 5), the three-dimensional structures can be etched to reveal the substrate (see, e.g., FIG. 16). A first layer of an etch block material is deposited on the polymeric matrix, including the holes formed in the polymeric matrix. The polymeric matrix is then removed, leaving an array of particles from the first layer adjacent to the semiconductor substrate. The array of particles defines a pattern. A second layer of an etching material is then deposited on the semiconductor substrate. The etch block material serves as a mask to limit or prevent etching of the semiconductor substrate that is facilitated by the etching material. A pattern defined by the array of particles is then catalytically transferred to the substrate to provide an array of wires formed from the semiconductor substrate.

In an aspect, a method for forming holes in or wires from a substrate comprises forming the holes or wires with the aid of a vapor phase oxidizing agent and/or a vapor phase chemical etchant. In some cases, the method comprises using a vapor phase oxidizing agent and a vapor phase chemical etchant. The vapor phase oxidizing agent can include one or more oxidizing chemicals. In some cases, the etching layer is exposed to an oxidizing agent, chemical etchant and water (e.g., water vapor).

In some embodiments, a method for forming a thermoelectric element comprises providing a substrate in a reaction space. The substrate can include a pattern of a metallic material adjacent to the substrate. The metallic material can be configured to catalyze the oxidation of the substrate, as described elsewhere herein. Next, the metallic material is exposed to a gas having an oxidizing agent and a chemical etchant to form holes in or wires from the substrate. The gas can comprise between about 1% and 99% (mole %) oxidizing agent, and between about 1% and 99% chemical etchant.

In some embodiments, a method for forming a thermoelectric element comprises providing a substrate in a reaction space. The substrate can include a pattern of a metallic material adjacent to the substrate. The metallic material can be configured to catalyze the oxidation of the substrate, as described elsewhere herein. The metallic material can then be contacted with a vapor phase oxidizing agent and a vapor phase chemical etchant to form holes in or wires from the substrate. The metallic material can be contacted with the vapor phase oxidizing agent and the vapor phase chemical etchant by directing the vapor phase oxidizing agent and the chemical etchant into the reaction space.

In some cases, the metallic material is simultaneously contacted with the vapor phase oxidizing agent and the vapor phase chemical etchant. Alternatively, the metallic material can be alternately and sequentially contacted with the vapor phase oxidizing agent and the vapor phase chemical etchant.

The gas can be a vapor phase mixture comprising a carrier gas. The carrier gas can be selected from $H_2$, $N_2$, He, Ne, Ar, $CO_2$ and combinations thereof.

The metallic material can be exposed to the gas for a time period between about 30 seconds and 60 hours. In some cases, the metallic material is exposed to the gas for a time period of at least about 0.01 seconds, 0.1 second, 1 second, 10 seconds, 20 seconds, 30 seconds, 1 minute, 2 minutes, 3 minutes, 4 minutes, 5 minutes, 10 minutes, 20 minutes, 30 minutes, 1 hour, 2 hours, 3 hours, 4 hours, 5 hours, 6 hours, 12 hours, 1 day, 2 days, 3 days, 4 days, 5 days, 6 days, 1 week, 2 weeks, 3 weeks or 1 month.

In some cases, a ratio (e.g., mole ratio) of oxidizing agent to chemical etchant in the gas is at least about 0.1:1, 0.5:1, 1:1, 1.5:1, 2:1, 3:1, 4:1, 5:1, 6:1, 7:1, 8:1, 9:1, 10:1, 100:1, 1000:1. In other cases, a ratio of chemical etchant to oxidizing agent in the gas is at least about 0.1:1, 0.5:1, 1:1, 1.5:1, 2:1, 3:1, 4:1, 5:1, 6:1, 7:1, 8:1, 9:1, 10:1, 100:1, 1000:1.

In some examples, during exposure of the substrate to the gas, the substrate can be heated to a temperature between about −50° C. and 200° C. In some cases, the gas can be heated to a temperature between about −50° C. and 200° C.

In some examples, exposing the metallic material to the gas etches the substrate at an etch rate of at least about 0.1 nanometers (nm)/second (s), 0.5 nm/s, 1 nm/s, 2 nm/s, 3 nm/s, 4 nm/s, 5 nm/s, 6 nm/s, 7 nm/s, 8 nm/s, 9 nm/s, 10 nm/s, 20 nm/s, 30 nm/s, 40 nm/s, 50 nm/s, 100 nm/s, 1000 nm/s, or 10,000 nm/s at 25° C. In some cases, the etch rate may be lower at elevated temperatures.

Methods for forming holes in, or wires from, a substrate can be additive or subtractive. Additive approaches comprise depositing particles of a catalyst material (e.g., silver) adjacent to a substrate, and forming holes in, or wires from, the substrate, as described above. In subtractive patterning, a catalyst material (e.g., silver) can be deposited in a blanket fashion over a substrate and subsequently removed in desired or otherwise predetermined locations to produce a catalyst pattern over the substrate. In one non-limiting approach, the catalyst material is deposited on the wafer and a masking material is deposited over the catalyst material. The masking material is then patterned with a resist mask (e.g., photolithography, electron-beam lithography, nanoimprint lithography, block copolymer lithography) to provide a resist pattern that is transferred into the masking material (e.g., by reactive ion etching) where it can serve as a hard mask for etching the underlying catalyst material (e.g., ion milling, reactive ion etching). Exposed portions of the catalyst material are then contacted with an etchant mixture (e.g., HF and $H_2O_2$) to etch the wafer. The masking material can be selected such that, upon exposure of the catalyst material to an etchant mixture, the masking material provides directional etching through the wafer with selectivity against the catalyst material, and that it is robust to serve as a sacrificial mask during a subsequent ion milling or etching step to remove the masking material. In some examples, the masking material is selected from silicon oxide, silicon nitride and silicon oxynitride. As an alternative subtractive patterning approach, a masking material can be deposited on the wafer using PVD (e.g., evaporation, electron-beam evaporation, sputtering), or CVD (e.g., plasma-enhanced, low pressure, or atmospheric pressure). The masking material is then patterned with a resist mask. The catalyst material is then deposited, in some cases in excess, using PVD, CVD (e.g., metalorganic chemical vapor deposition, electron or ion beam-induced deposition), electrochemical deposition or electro-less deposition. Any excess material is then removed, for example, using a chemical mechanical polishing step and/or ion milling step. Exposed portions of the catalyst material are then contacted with an etchant mixture (e.g., HF and $H_2O_2$) to etch the wafer. The masking material may be selected such that, upon exposure of the catalyst material to an etchant mixture, the masking material provides directional etching of the wafer with selectivity against the wafer, and that it is non-reactive during the catalyst material deposition and is sufficiently robust during removal, such as using chemical mechanical polishing or ion milling. The masking material can be a silicon oxide, such as silicon dioxide. When the masking material is silicon dioxide, wet or dry wafer oxidation can be performed.

Figure 10:
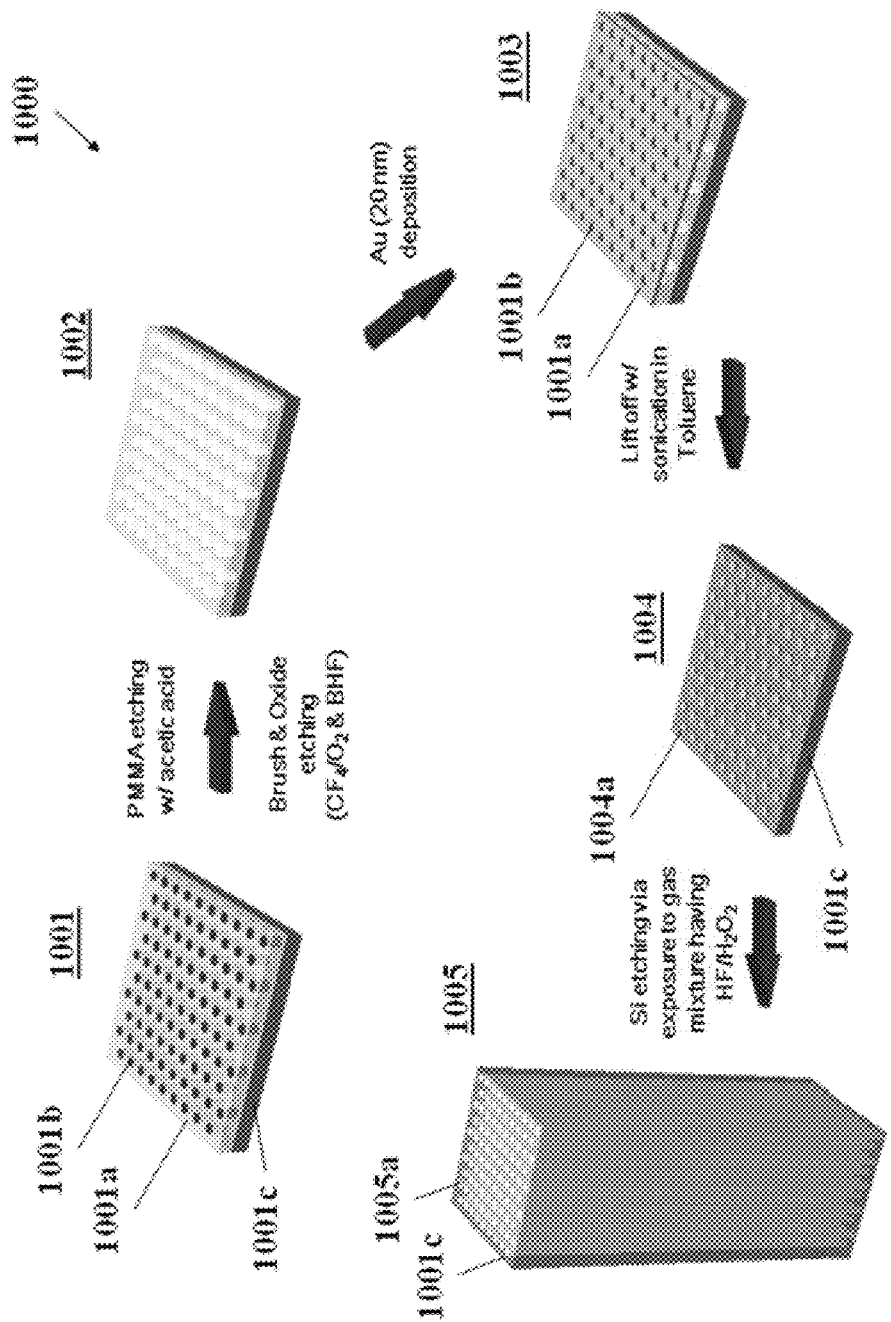
FIG. 10 shows a process for forming a thermoelectric device, in accordance with an embodiment of the present disclosure.

FIG. 10 shows a process 1000 for forming a thermoelectric device, in accordance with an embodiment of the present disclosure. In a first operation 1001, a mask (or template) 1001a having three-dimensional structures 1001b is provided over a substrate 1001c. The substrate 1001c can be a semiconductor substrate, such as a silicon substrate (e.g., n-type or p-type silicon). The three-dimensional structures 1001b can be cylinders (or rods). Alternatively, the three-dimensional structures 1001b can have other shapes, such as, e.g., triangular, square, or rectangular. The three-dimensional structures 1001b can have various sizes and distributions. In some situations, the three-dimensional structures 1001b have widths (or diameters) between about 1 nanometers ("nm") and 500 nm, or 5 nm and 100 nm, or 10 nm and 30 nm. The three-dimensional structures 1001b can have a center-to-center spacing between about 1 nm and 500 nm, or 5 nm and 100 nm, or 10 nm and 30 nm. In some embodiments, the three-dimensional structures 1001b are distributed in an array of three-dimensional structures. In some examples, the three-dimensional structures 1001b in the array are monodisperse.

In some situations, the three-dimensional structures 1001b are in a close packing arrangement, such as a hexagonally close packing arrangement. In other situations, the three-dimensional structures 1001b are in a random arrangement. In some cases, the three-dimensional structures 1001b are arranged in groups. Each group can have a predetermined distribution of the three-dimensional structures. The three dimensional structures 1001b can be asymmetric, having lengths longer than their widths (or diameters).

The mask 1001a can be formed of a first polymeric material, such as polystyrene, and the three-dimensional structures 1001b can be formed of a second polymeric material, such as PMMA. The mask 1001a is formed by providing a mixture comprising the first and second polymeric materials, and coating the mixture onto the substrate 1001c using, for example, a spin coater or other systems and devices that may be used in semiconductor fabrication, such as, for example, dip coater, ink jet printing, spray coating, drop coasting, layer by layer coating using the Langmuir-Blodgett trough. In some cases, a spin coater is used to coat the mixture onto the substrate 1001c. A spin coater can be operated at between about 100 revolutions per minute (RPM) and 10,000 RPM, or 1000 and 4000 RPM, or 2000 and 3000 RPM, for a time period of at least about 1 second, 2 seconds, 3 seconds, 4 seconds, 5 seconds, 10 seconds, 15 seconds, 20 seconds, 25 seconds, 30 seconds, 35 seconds, 40 seconds, 45 seconds, 50 seconds, 55 seconds, 1 minute, 5 minutes, 10 minutes, 30 minutes, 1 hour, 12 hours, 24 hours, or more.

In some embodiments, the second polymeric material phase separates in a matrix of the first polymeric material to form the three-dimensional structures. The mask 1001a can be formed of a block copolymer having the first polymeric material and second polymeric material.

In some embodiments, after the mixture is applied (e.g., spin-coated) to the substrate 1001c, the substrate can be annealed at a temperature between about 100° C. and 300° C., or 150° C. and 250° C., or 180° C. and 210° C. for a period of at least about 1 second, or 10 seconds, or 30 seconds, or 1 minute, or 10 minutes, or 20 minutes, or 30 minutes, or 1 hour, or 2 hours, or 3 hours, or 4 hours, or 5 hours, or 6 hours, or 12 hours, or 24 hours, or 48 hours. The substrate can then be irradiated with ultraviolet light (e.g., 254 nm UV light) for a period of at least about 1 min, or 2 min, or 3 min, or 4 min, or 5 min, or 10 min, or 15 min, or 20 min, or 25 min, or 30 min.

Next, in a second operation 1002, the second polymeric material (including the three-dimensional structures 1001b) is etched relative to the first polymeric material. The second polymeric material can be etched with the aid of an acid, such as, e.g., nitric acid, acetic acid, hydrogen fluoride (HF), hydrogen chloride (HCl), hydrogen bromide (HBr), or hydrogen iodide (HI), or other etching chemistries, such as ozone or sodium hydroxide (NaOH). In an example, if the second polymeric material is formed of PMMA, the second polymeric material can be etched using acetic acid. The acid can be introduced in the gas phase, such as with the aid of a carrier gas (e.g., bubbling the carrier gas through a solution comprising HF). Alternatively, gas phase etching can be performed, such as, for example, reactive ion etching using $O_2$, $CF_4$, $CHF_3$ or combinations thereof. Etching the polymeric material generates holes in the mask. The holes can expose a surface of the substrate 1001c adjacent to the mask 1001a. The exposed surface can include a layer of an oxide (native or thermally grown), such as a silicon oxide (e.g., silicon dioxide) if the substrate 1001c is formed of silicon. The oxide layer is removed by exposing the mask and the exposed portions of the substrate 1001c to an oxide etchant which is configured to etch the silicon oxide. In an example, the mask and exposed portions of the substrate 1001c are exposed to $CF_4/O_2$ and/or a buffered oxide etch (or a buffered hydrofluoric etch, "BHF"). In some examples, the mask and the exposed portions of the substrate are exposed to a vapor phase acid, such as hydrogen fluoride (HF) in the gas phase.

BHF can be a mixture of a buffering agent, such as ammonium fluoride ($NH_4F$), and hydrofluoric acid (HF). In some cases, HCl is added to a BHF solution in order to dissolve insoluble products. In an example, a buffered oxide etch solution comprises a 6:1 volume ratio of about 40% $NH_4F$ in water to 49% HF in water. This solution can etch thermally grown oxide at a rate of at least about 0.1 nanometers (nm)/second (s), 0.5 nm/s, 1 nm/s, 2 nm/s, 3 nm/s, 4 nm/s, 5 nm/s, 6 nm/s, 7 nm/s, 8 nm/s, 9 nm/s, 10 nm/s, 20 nm/s, 30 nm/s, 40 nm/s, 50 nm/s, 100 nm/s, 1000 nm/s, or 10,000 nm/s at 25° C. Exposing the mask and the exposed portions of the substrate 1001c to an oxide etchant can remove the oxide layer from the exposed portions of the substrate 1001c.

In some embodiments, during the second operation 1002 the substrate can be exposed to an acid (e.g., acetic acid, HF, HI) for a period of at least about 1 min, or 2 min, or 3 min, or 4 min, or 5 min, or 10 min, or 15 min, or 20 min, or 25 min, or 30 min, and water for a period of at least about 1 second, or 10 seconds, or 30 seconds, or 1 min, or 2 min, or 3 min, or 4 min, or 5 min to remove the second polymeric material (e.g., PMMA) and crosslinking a matrix having the first polymeric material. The acid can remove any native or thermally grown oxide on the substrate, in some cases without removing or substantially removing the mask 1001a.

Next, in a third operation 1003, a layer of a metallic material is deposited on the mask 1001a and the exposed portions of the substrate 1001c. In some embodiments, the layer of metallic material includes one or more elemental metals. For instance, the layer of metallic material can include one or more metals selected from gold, silver, platinum, chromium, molybdenum, tungsten, osmium, iridium, rhodium, ruthenium, palladium, copper, nickel and other metals (e.g., noble metals), and any combinations thereof. In other examples, the layer of the metallic material can include a non-noble metal, such as copper, nickel, or combinations thereof.

The layer of the metallic material can include a material that may catalyze the decomposition of a chemical etchant. The layer of the metallic material can be deposited with the aid of various deposition techniques, such as physical vapor deposition (e.g., sputtering, evaporative deposition), chemical vapor deposition (CVD), atomic layer deposition (ALD), or electroplating. In some embodiments, the layer of the metallic material, as formed, has a thickness between about 1 nm to about 500 nm, or 5 nm and 100 nm, or 10 nm and 30 nm. The layer of metallic material is formed on the mask and the exposed portions of the substrate 1001c.

Next, in a fourth operation 1004, the mask 1001a is removed to leave an array (or pattern) of metallic material 1004a on the substrate 1001c. In some embodiments, the array of metallic material is monodisperse.

Next, in a fifth operation 1005, the metallic material 1004a and the substrate 1001c are exposed to an oxidizing agent (e.g., $O_3$, $NO_2$, $H_2O_2$) and an etchant (e.g., HF). One or both of the oxidizing agent and the etchant can be delivered in the gas phase (e.g., through a vapor phase mixture having the oxidizing agent, the etchant and a carrier gas) and exposed to the metallic material 1004a and the substrate 1001c. The oxidizing agent and the etchant can be delivered using a vapor delivery system, such as a pump.

The metallic material 1004a can facilitate the catalytic oxidation of the substrate 1001c at the metal-substrate interface, thereby forming an oxide between the metallic material 1004a and the substrate 1001c. An etchant then removes the oxide. Subsequent oxidation of the substrate and removal of an oxide formed between the metallic material and the substrate generates holes in the substrate. In some embodiments, the holes 1005a have lengths that are longer than the widths (or diameters) of the holes 1005a (i.e., the holes 1005a are anisotropic). The metallic material can then be removed with the aid of an etchant to leave holes in the substrate 1001c.

In some cases, a templated resist (or mask) can be defined onto a substrate by, for example, nano-imprinting, block copolymer lithography, photolithography, e-beam lithography, etc. Before metal catalyst deposition, a native oxide (e.g., silicon dioxide) formed adjacent to the substrate can be removed by a vapor phase chemical etchant, such as, for example, HF, HCl, HBr, HI or a combination thereof. The vapor phase etchant can preserve the resist template as compared to a wet etchant (e.g., HF(aq)), which may lead to degradation of the resist template and lead to ill-defined catalyst shapes.

Alternatively, in the third operation 1003a layer of a first metallic material can be deposited on the mask 1001a and exposed portions of the substrate 1001c. The first material can be an etch block material. In some cases, the layer of the first metallic material includes one or more metals selected from chromium, molybdenum and tungsten. In the fourth operation 1004 the mask 1001*a* can be removed to expose the substrate 1001*c*, as described above. Next, a layer of a second metallic material can be deposited on the layer of the first metallic material and the substrate 1001*c*. The second material can include an etching material. The layer of the second metallic material can then be exposed to an oxidizing agent (e.g., $O_3$, $NO_2$, $H_2O_2$) and an etchant (e.g., HF) to form cylinders in the substrate 1001*c*. The oxidizing agent and the etchant can be delivered in the gas phase (e.g., delivered to a reaction space) and exposed to the layer of the second material and the substrate 1001*c*. The layer of the first and second metallic materials on the cylinders can then be removed to leave cylinders (e.g., free-standing cylinders) formed from the substrate 1001*c*. In some situations, the bases of the cylinders are attached to the substrate 1001*c*.

Figures 11A, 11B, 11C:
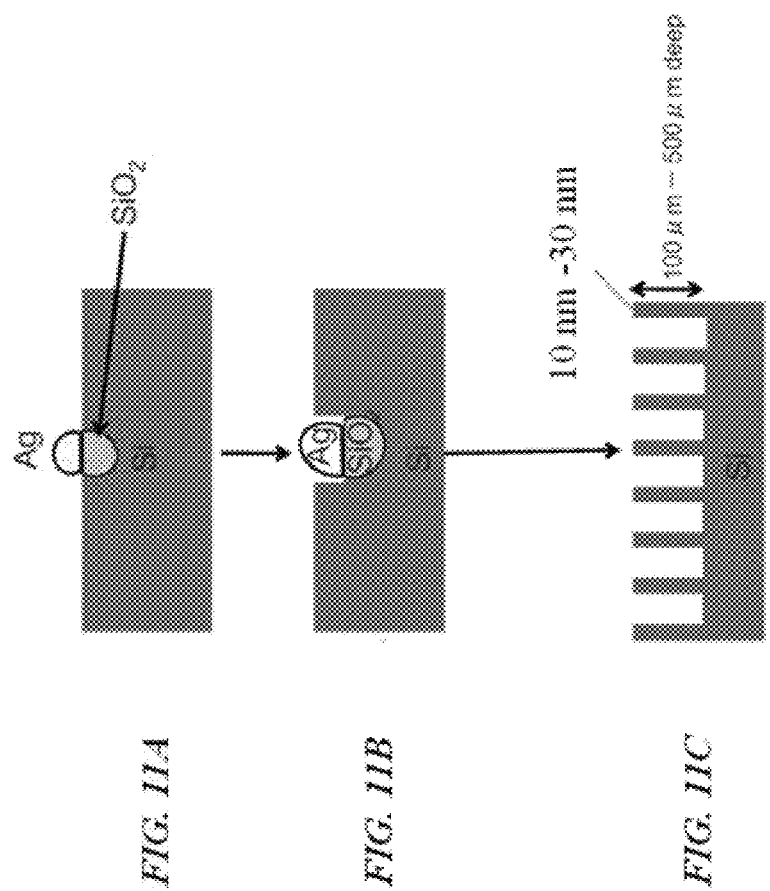
FIGS. 11A-11C schematically illustrates a process for catalytically forming an array of holes, in accordance with an embodiment of the present disclosure.

FIGS. 11A-C schematically illustrate a process for catalytically etching a silicon substrate, in accordance with an embodiment of the present disclosure. The illustrated process can be applied to various semiconductor materials. In FIG. 11A, with a silver catalyst deposited on a silicon substrate, the silicon substrate and the catalyst are exposed to an oxidizing agent, such as hydrogen peroxide ($H_2O_2$), to form silicon dioxide, which is then contacted with a chemical etchant, such as hydrofluoric acid (HF), to remove the silicon dioxide (FIG. 11B). The oxidizing agent and the chemical etchant may be exposed to the silicon substrate and the catalyst in the gas phase, in some cases with the aid of a carrier gas (e.g., He, $N_2$, Ar, $H_2$, $CO_2$). Additional exposure of the silicon substrate and the catalyst to the oxidizing agent and the chemical etchant forms an array of holes in the silicon substrate, as shown in FIG. 11C. In some situations, the silicon substrate and the catalyst are simultaneously contacted with the oxidizing agent and the chemical etchant, while in other situations the silicon substrate and the catalyst are alternately and sequentially contacted with the oxidizing agent and the chemical etchant.

The process of FIGS. 11A-11C may be used to form a pattern of holes or wires in a substrate, such as a semiconductor, insulating or metallic substrate.

A metal catalyst can have various shapes and sizes. In some embodiments, a metal catalyst is substantially symmetrical, such as in the form of a cylinder or sphere, or a partial cylinder or partial sphere. For example, an individual catalyst particle can be cylindrical or substantially cylindrical. As another example, an individual catalyst particle can be hemispherical or substantially hemispherical. As an alternative, a catalyst particle can be shaped as an annulus (or ring-shaped). In such a case, the chemical etch of the substrate (e.g., silicon) can proceed in a vertical direction with reduced or minimal clumping or agglomeration of catalyst particles with each other. The central opening in the annulus can focus the constituents of the chemical etchant (e.g., fluoride and hydronium ions if the chemical etchant is hydrofluoric acid) so that etching of the substrate is more uniform and less sensitive to fluctuation in the reactant concentration.

In some examples, annulus-shaped catalyst particles are formed by providing a mask adjacent to a substrate, forming holes in the substrate that are ring-shaped (e.g., by exposing the mask to light through a reticle that has ring-shaped features), depositing a metallic material in the holes, and removing the mask.

For example, a method for forming a thermoelectric device comprises providing ring-shaped particles of a metallic material adjacent to a substrate and exposing the ring-shaped particles to an oxidizing agent and an etchant to catalytically etch the substrate at an etch rate of at least about 0.01 micrometers/second to form holes in or wires from the substrate. The ring-shaped particles can be formed by providing a mask adjacent to the substrate (e.g., spin-coating the mask), defining an array of ring-shaped holes in the mask (e.g., by photolithography), depositing a layer of the metallic material adjacent to the mask and exposed portions of the substrate, and removing the mask to provide the ring-shaped particles of the metallic material adjacent to the substrate. In some cases, the mask can comprise three-dimensional structures phase-separated in a polymer matrix, and the ring-shaped holes can be formed by selectively removing the three-dimensional structures with respect to the polymer matrix to provide the ring-shaped holes in the polymer matrix. The holes expose portions of the substrate.

Substrate etching to form holes or wires can proceed along directions where the most surface area is in contact with the substrate. Roughness (or protrusions) on the portion of the particle surface that is not in a preferable etch direction (e.g., along a direction orthogonal to a surface of the substrate) may increase the probability of etching in directions other than the preferable etch direction—e.g., it may reduce the directional verticality of etching. Catalyst topology (e.g., as defined by Euler Characteristic) may play a role in verticality. For example, boring a hole or holes within a catalyst can allow access of reactants (e.g., oxidizing agent and chemical etchant) in the fluid to the etching surface, thereby focusing etching where the hole or holes are present (e.g., in the center of the catalyst as opposed to the edges). This can increase verticality by focusing downward etching where reactants are present at the center of the catalyst. It can also decrease secondary porosity by focusing etching within the primary pore and by increasing the transport of reaction byproducts away from the etch surface, the latter of which simultaneously increases maximum etch depth.

Figure 15B:
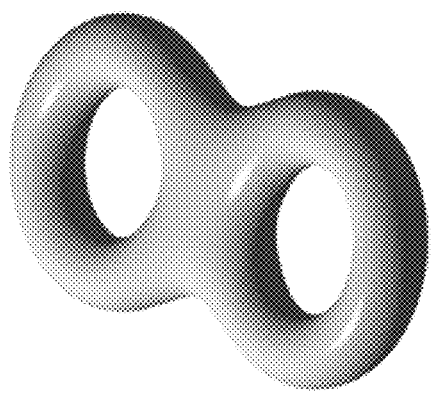
FIG. 15A-15C show catalyst particles with various Euler Characteristics.
Figure 15C:
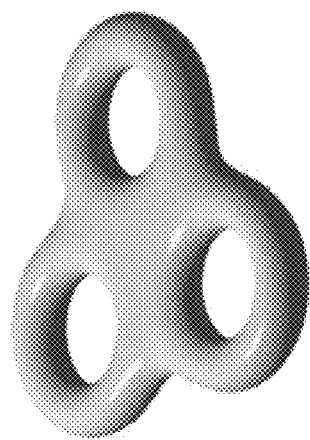
Figure 15A:
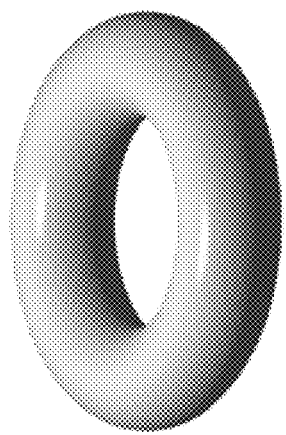

In some examples, a catalyst particle configured for enhanced etching (e.g., enhanced verticality) has a shape with an Euler Characteristic (or Euler-Poincaré characteristic)<2 (for comparison, a cylinder has an Euler Characteristic of 2). In an example, the catalyst particle is a torus (or annulus) with an Euler Characteristic of zero (FIG. 15A). In another example, the catalyst particle is a double torus with an Euler Characteristic of −2 (FIG. 15B). In another example, the catalyst particle is a triple torus with an Euler Characteristic of −4 (FIG. 15C). Catalyst particles with such shapes can be formed by, for example, using photolithography to define a pattern of holes in a mask and depositing metallic particles in the holes to form catalyst particles.

The disparity in work function between the substrate and etchant can result in depletion of charge carriers (ions, holes or electrons in the etch material) at the boundary between the substrate and the etchant. The disparity in work function between the catalyst and substrate can alter the concentration of carriers both in the etch material and in the fluid, depending on, without limitation, a) the etch material work function, which can depend on substrate doping, and b) the catalyst work function, which can depend on which metal is used as a catalyst. Using a catalyst with a lower (i.e., more negative) work function than the substrate can result in a concentration of electron holes at the pore/hole etch front. Using a catalyst with a comparable work function can result in an even or substantially even distribution of electron hole concentration at the pore etch front. Using a catalyst with a higher (i.e., less negative) work function than the substrate can result in increased depletion of electron holes as compared to the concentration in the substrate.

In some embodiments, the relation between metal catalyst and substrate (e.g., p-type silicon) work function can be controlled to optimize etch verticality and to minimize the formation of secondary porosity—e.g., holes formed along a direction that is angled with respect to (e.g., orthogonal to) the direction of etching. The metal catalyst can catalyze the reduction of the $H_2O_2$ or other oxidizing agent and form a Schottky junction with the material being etched (e.g., silicon), which can either focus electron holes at the junction at the pore etch front, further deplete the front by driving away electron holes, or form an Ohmic contact. For example, a catalyst such as $Pt_2$—Si can be employed to etch highly doped p-type silicon, given that $Pt_2$—Si has a slightly lower (i.e., more negative) work function than highly doped silicon. This can in a slight increase in electron hole concentration at the pore/hole etch front, thereby providing reactants (electron holes) in the location where it is preferred for the etch proceed. However, using $Pt_2$—Si with low-doped p-type silicon may increase the concentration of electron holes in the depletion region formed between the silicon substrate and etchant such that secondary pore formation may increase. As such, it may be preferable to balance the work functions of the substrate and catalyst. In some examples, the catalyst material is selected to have a work function that is lower than that of the substrate. In other examples, the catalyst material is selected to have a work function that is greater than or equal to that of the substrate. The selection of work function is based at least in part on the desired concentration of electron holes at the interface between the catalyst and the substrate.

Before catalytic etching, the substrate (e.g., silicon wafer) can be coated with a passivation layer comprising a passivation material that can protect the underside of the substrate from etching by the etchant mixture (e.g., HF and $H_2O_2$). This can provide for holes or wires with substantially high uniformity and aspect ratios, and aid in minimizing the formation of pores that are angled with respect to the holes or wires. The passivation material can be an oxide, nitride, sulfide, carbide, or a combination thereof. In some examples, the passivation material is a carbide provided by reacting an exposed hydrogen-terminated surface of the substrate with a hydrocarbon, such as an alcohol, aldehyde, alkoxy halide, ketone, alkane, alkene or alkyne. In an example, unsaturated hydrocarbons, such as alkenes or alkynes, can be used to react with hydrogen-terminated silicon prepared via hydrogen fluoride etching. This hydrosilylation reaction can be performed thermally or catalyzed by ultraviolet irradiation of the hydrogen-terminated silicon to form carbon-silicon bonds between the passivating species and the silicon. The silicon-carbon bond can be more stable against attack by hydrogen fluoride, which can provide for a passivation layer. Alternatively, alcohols, alkoxyl halides and similar molecules can be used to react with the hydrogen-terminated silicon to form silicon-oxygen-carbon bonds, which can also serve as passivation layers. In some situations, organosulfur compounds, such as thiols, may adversely interfere with catalyst activity and should be avoided or used in concentrations that are selected so as to not adversely interfere with catalyst activity. This passivation reaction can be performed before or during the catalytic etch. In the case of passivation during the etch, the passivating species may be added to the etching medium.

Passivating species include carbon-containing compounds (e.g., hydrocarbons), nitrogen-containing compounds (e.g., $NH_3$, $N_2H_6$), sulfur-containing compounds (e.g., $H_2S$), and oxygen-containing compounds (e.g., $O_2$, $O_3$, $H_2O_2$, alcohols)

Alternatively, material may be deposited between catalyst particles using techniques such as atomic layer deposition, plasma enhanced CVD, low pressure CVD, sputtering, evaporation or spin-on processing. Suitable materials include, without limitations, dielectrics, such as silicon nitride, silicon oxide, polysilicon, amorphous silicon, spin-on-glass, spin-on-dopants; organic materials, such as photoresists, electron-beam resists, or other polymers, such as polyimide, polystyrene, poly-methylmethacrylate; or non-catalytic metals, such as chromium or tantalum.

Alternatively, the substrate (e.g., silicon) may be doped n-type to reduce the electron hole carrier density within the substrate. The electron holes may be responsible for etching, and reducing their concentration can reduce undesired etching of substrate in the etchant. In an example, such doping is achieved during the substrate manufacturing process by addition to the substrate source material, to generate a fully n-doped substrate (e.g., n-doped silicon wafer). In another example, the surface of the substrate can be highly doped n-type while the bulk of the substrate remains p-type or n-type. This can be achieved by ion implantation, solid source doping, spin-on-doping, or semiconductor epi growth.

Following formation of holes or wires, the passivation layer can be removed. Examples of techniques that can be used to remove the passivation layer include wet etching, dry etching, reactive ion etching, chemical mechanical polishing and ion milling.

In some situations, during etching, an electric field (or voltage) can be provided across the substrate, such as along the direction of etching. The electric field can be provided using a pair of electrodes adjacent to opposing surfaces of the substrate that are orthogonal to the direction of etching. In some examples, a voltage of at least about 0.1 v, 0.5 v, 1 V, 2 V, 3 V, 4 V, 5 V, 6 V, 7 V, 8 V, 9 V, 10 V, 20 V, 30 V, 40 V, 50 V, 60 V, 70 V, 80 V, 90 V, or 100 V is provided across the substrate during etching.

Figure 12:
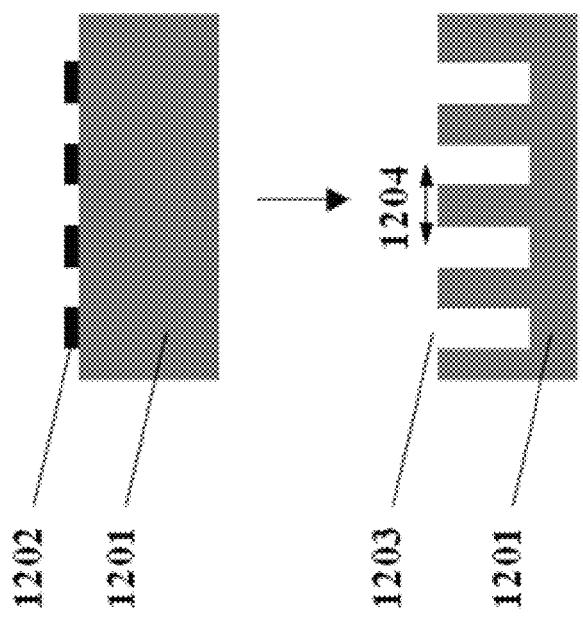
FIG. 12 schematically illustrates a process for forming a pattern of holes, in accordance with an embodiment of the present disclosure.

Metal catalysts of the present disclosure can be used to form holes in, or wires from, a substrate, such as by transferring a pattern of holes to the substrate. FIG. 12 schematically illustrates a process for catalytically transferring a pattern to a substrate 1201. The substrate 1201 may formed of one or more semiconductor materials. The pattern is characterized by the distribution of particles 1202 of a metallic material on the substrate 1201. The metallic material may include one or more of gold, silver, platinum, chromium, molybdenum, tungsten, osmium, iridium, rhodium, ruthenium, palladium, copper, nickel and other metals (e.g., noble metals), and any combinations thereof, or any non-noble metal that can catalyze the decomposition of a chemical oxidant, such as, for example, copper, nickel, or combinations thereof. The particles 1202 may be formed as described elsewhere herein, such as, e.g., by forming a mask with a pattern of holes (e.g., nanoholes), depositing the metallic and removing the mask. The particles 1202 may be disposed directly on the substrate 1201, or, alternatively, on one or more intervening layers on the substrate 1201, such as an oxide layer. The metallic particles 1202 and the substrate 1201 are then exposed to a chemical etchant and an oxidizing agent to anisotropically etch the substrate 1201 to provide a pattern of holes 1203 in the substrate 1201. The chemical etchant and/or the oxidizing agent can be exposed to the substrate 1201 and the metallic particles 1202 in the gas phase. The particles 1202 can then be removed, such as with the aid of an etching chemistry that is selective to the metallic material. The holes 1203 may then be formed with a secondary material, such as a semiconductor or dielectric material, to form inclusions.

The pattern of holes 1203 may have a pitch (e.g., center-to-center spacing between adjacent holes) 1204 that is less than or equal to about 5000 nanometers (nm), or 1000 nm, or 500 nm, or 400 nm, or 300 nm, or 200 nm, or 100 nm, or 50 nm, or 40 nm, or 30 nm, or 20 nm, or 15 nm, or 10 nm, or 5 nm, or less. Exposed surfaces of each of the holes 1203 can have a roughness, as measured by transmission electron microscopy (TEM), between about 0.5 nm and 50 nm, or 1 nm and 20 nm, or 1 nm and 10 nm.

At least a fraction of the metallic material from the particles 1202 may be deposited on the exposed surfaces of the holes 1203. This may be the case if, for example, a residual amount of the metallic materials (or residue) remain after removal of the particles 1202. In some cases, the fraction of metallic material adsorbed on the exposed surfaces of the holes 1203, taken against the number of surface atoms on the exposed surfaces, is at least about 0.000001%, 0.00001%, 0.0001%, 0.001%, 0.01%, 0.1%, 1%, 5%, 10%, 15%, or 20%, as measured by x-ray photoelectron spectroscopy (XPS). In other cases, however, the fraction of metallic material adsorbed on the exposed surfaces of the holes 1203, taken against the number of surface atoms on the exposed surfaces, is at most about 0.000001%, 0.00001%, 0.0001%, 0.001%, 0.01%, 0.1%, 1%, 5%, 10%, 15%, 20%, or 25%, as measured by XPS. In some situations, the fraction of metallic material adsorbed on exposed surfaces of the holes 1203, taken against the number of surface atoms on the exposed surfaces, is between about 0.000001% and 25%, as measured by XPS.

Figure 13:
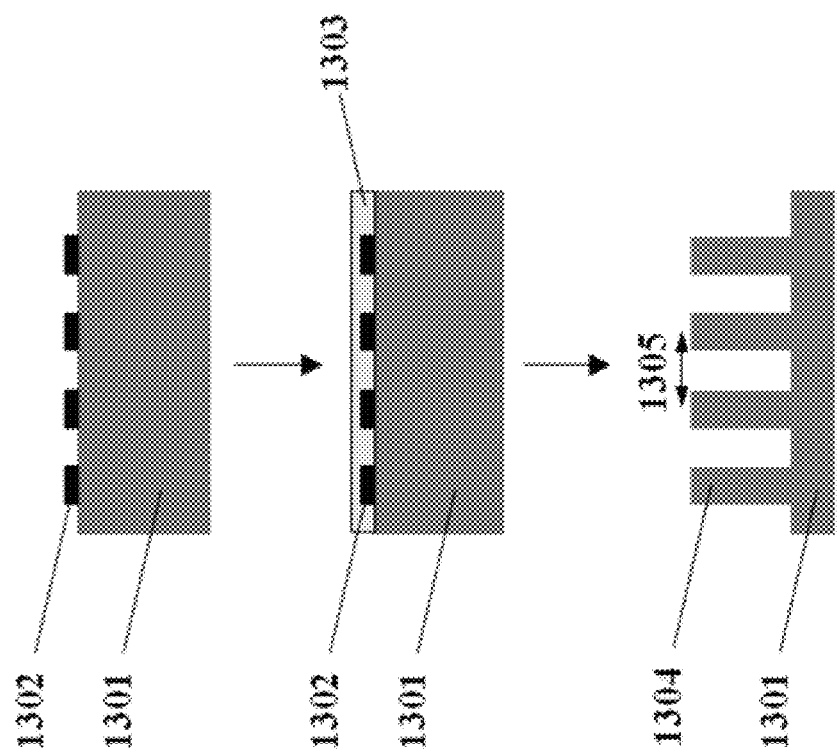
FIG. 13 schematically illustrates a process for forming a pattern of wires, in accordance with an embodiment of the present disclosure.

FIG. 13 schematically illustrates a process for catalytically transferring a pattern to a substrate 1301. In a first step, a first layer 1302 of particles having an etch block material is formed on the substrate 1301, as described elsewhere herein, such as, e.g., by forming a mask with a pattern of holes, depositing the first layer 1302 and removing the mask. The first layer 1302 can include a plurality of particles. The material of the first layer 1302 can include one or more of chromium, molybdenum and tungsten. The particles of the first layer 1302 may be disposed directly on the substrate 1301, or, alternatively, on one or more intervening layers on the substrate 1301, such as an oxide layer (e.g., a native oxide layer). A second layer 1303 having a metallic material is then deposited on the first layer 1302, as described elsewhere herein. The material of the second layer 1303 may be different from the material of the first layer 1302. The metallic material of the second layer 1303 can include one or more of gold, silver, platinum, chromium, molybdenum, tungsten, osmium, iridium, rhodium, ruthenium, palladium, copper, nickel and other metals (e.g., noble metals), and any combinations thereof, or any non-noble metal that can catalyze the decomposition of a chemical oxidant, such as, for example, copper, nickel, or combinations thereof. Next, the first layer 1302 and second layer 1303 are exposed to a chemical etchant and an oxidizing agent. The chemical etchant and/or the oxidizing agent can be exposed to the first layer 1302 and the second layer 1303 in the gas phase. With the first layer serving as a mask (or etch block layer), the metallic material of the second layer 1303 etches portions of the substrate 1301 that are in contact with the second layer 1303. Portions of the substrate 1301 that are in contact with the first layer 1302 may not be etched. This provides a pattern of wires (e.g., nanowires) 1304 in the substrate 1301. The material comprising the first layer 1302 and second layer 1303 may then be removed, such as with the aid of an etching chemistry that is selective to the metallic materials and not the material comprising the substrate 1301.

The pattern of wires 1304 may have a pitch 1305 that is less than or equal to about 5000 nanometers (nm), or 1000 nm, or 500 nm, or 400 nm, or 300 nm, or 200 nm, or 100 nm, or 50 nm, or 40 nm, or 30 nm, or 20 nm, or 15 nm, or 10 nm, or 5 nm, or less. Exposed surfaces of each of the wires 1304 may have a roughness, as measured by transmission electron microscopy (TEM), between about 0.5 nm and 50 nm, or 1 nm and 20 nm, or 1 nm and 10 nm.

At least a fraction of the metallic material from the first layer 1302 and/or the second layer 1303 may be deposited on the exposed surfaces of the wires 1304. This may be the case if, for example, a residual amount of one or both of the metallic materials remains on the exposed surfaces of the wires 1304 after removal of the first layer 1302 and the second layer 1303. In some cases, the fraction of metallic material adsorbed on the exposed surfaces of the wires 1304, taken against the number of surface atoms on the exposed surfaces, is at least about 0.000001%, 0.00001%, 0.0001%, 0.001%, 0.01%, 0.1%, 1%, 5%, 10%, 15%, or 20%, as measured by XPS. In other cases, however, the fraction of metallic material adsorbed on the exposed surfaces of the wires 1304, taken against the number of surface atoms on the exposed surfaces, is at most about 0.000001%, 0.00001%, 0.0001%, 0.001%, 0.01%, 0.1%, 1%, 5%, 10%, 15%, 20%, or 25%, as measured by XPS. In some situations, the fraction of metallic material adsorbed on exposed surfaces of the wires 1304, taken against the number of surface atoms on the exposed surfaces, is between about 0.000001% and 25%, as measured by XPS.

A hole or wire of the disclosure may have a surface roughness that is suitable for optimized thermoelectric device performance. In some cases, the root mean square roughness of a hole or wire is between about 0.1 nm and 50 nm, or 1 nm and 20 nm, or 1 nm and 10 nm. The roughness can be determined by transmission electron microscopy (TEM) or other surface analytical technique, such as atomic force microscopy (AFM) or scanning tunneling microscopy (STM). The surface roughness may be characterized by a surface corrugation.

Exposed surfaces of holes or wires can be covered with a layer of an oxide, such as a semiconductor oxide, metal oxide, or a semiconductor and metal oxide. In some cases, the oxide is a native oxide, such as a native oxide or silicon (e.g., $SiO_2$).

The doping configuration of thermoelectric elements of the disclosure may be selected to control the thermal conductivity and thermoelectric power of a thermoelectric device having the thermoelectric elements. The thermal conductivity and the thermoelectric power may be controlled substantially independently of the electrical conductivity of the thermoelectric elements by controlling dimensions and doping, respectively, of the thermoelectric elements. As an example, the doping p-type or n-type doping concentration of thermoelectric elements comprising holes or wires may be controlled independently of the dimensions (e.g., length, hole or wire diameters) of the thermoelectric elements. Various approaches for controlling thermal conductivity and thermoelectric power of semiconductor nanowires are described in U.S. Patent Publication No. 2009/0020148 ("METHODS AND DEVICES FOR CONTROLLING THERMAL CONDUCTIVITY AND THERMOELECTRIC POWER OF SEMICONDUCTOR NANOWIRES"), which is entirely incorporated herein by reference.

Methods described herein can be implemented using systems at ultrahigh vacuum, high vacuum, vacuum, low pressure, ambient pressure or high pressure (see below). In some cases, thermoelectric elements are formed at low pressure, such as using a vacuum chamber. In other cases, thermoelectric elements are formed in air. Alternatively, thermoelectric elements can be formed in an inert gas (e.g., He, $N_2$, Ar, $H_2$, $CO_2$) atmosphere.

Methods described herein can be automated with the aid of computer systems having storage locations with machine-executable code implementing the methods provided herein, and one or more processors for executing the machine-executable code.

Systems for Forming Thermoelectric Elements

Another aspect of the present disclosure provides a system for forming a thermoelectric element, comprising a reaction space having a substrate holder that is configured to hold a substrate, and a first vapor source in fluid communication with the reaction space. The first vapor source can supply an oxidizing agent in the reaction space. The system can further include a second vapor source in fluid communication with the reaction space. The second vapor source can supply a chemical etchant to the reaction space. The system can include a controller having a processor (or a plurality of processors) that is programmed to execute machine-readable instructions, which when executed by the processor implement any of the methods disclosed herein. For example, the controller can implement a method comprising (i) contacting an etching layer adjacent to a substrate in the reaction space with the vapor phase oxidizing agent from the first vapor source, and (ii) contacting the etching layer with the chemical etchant from the second vapor source. The first vapor source and the second vapor source can be the same vapor source.

In some examples, the system can include a pressure system in fluid communication with the reaction space. The pressure system can be configured to regulate the pressure of the reaction space. In some examples, the pressure system includes one or more vacuum pumps selected from mechanical pumps, rotary vain pumps, turbomolecular pumps, ion pumps, cryopumps and diffusion pumps. The pressure system can include valves, such as throttle valves. The pressure system can include a pressure sensor for measuring the pressure of the reaction space and relaying the pressure to the controller, which can regulate the pressure with the aid of one or more vacuum pumps of the pressure system.

Figure 14:
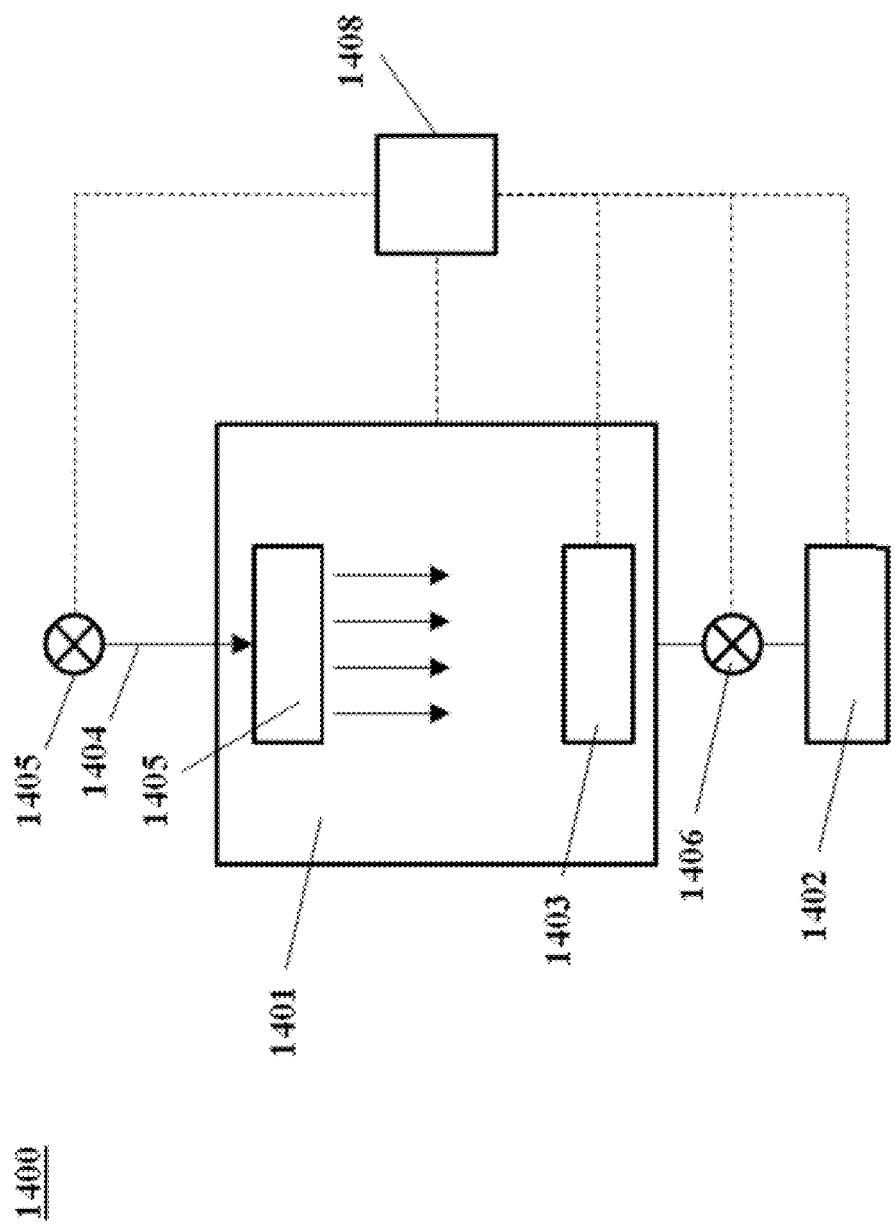
FIG. 14 schematically illustrates a system for forming a thermoelectric device, in accordance with an embodiment of the present disclosure.

FIG. 14 shows a system 1400 for forming a thermoelectric device, in accordance with an embodiment of the present disclosure. The system 1400 includes a reaction space 1401 in fluid communication with a pressure system 1402. The system 1400 includes a susceptor (or substrate holder) 1403 having one or more substrates (not shown) disposed thereon. A vapor source 1404 provides a first and second vapor into the reaction space 1401. The susceptor 1403 can include one or more heating and/or cooling elements for regulating the temperature of a substrate during processing (i.e., thermoelectric element formation, etc.). In the illustrated example, the vapor source 1404 is directed to a showerhead 1405, which distributes the vapor source over the substrate holder 1403. The showerhead in some situations can be precluded. Valves 1406 and 1407 can regulate the flow of one or more vapors into and out of the reaction space 1401. A controller 1408 coupled (dotted lines) to the reaction space 1401, the pressure source 1402 and the valves 1406 and 1407 aids in regulating the pressure of the reaction space prior to, during and after thermoelectric device formation, the rate at which vapor sources flow into the reaction space 1401, and the temperature of the susceptor 1403 (e.g., susceptor temperature during processing). The controller 1408 comprises a computer processor (also "processor" herein) or a plurality of processors, memory (e.g., read-only memory, random-access memory, flash memory), physical storage media (e.g., hard disk, optical media), a communications interface (e.g., network card) and a display interface. The controller can be coupled to the cloud or a distributed network for remote processing, for example.

The system 1400 can include a plurality of vapor sources. Each of the plurality of vapor sources can introduce an oxidizing agent or chemical etchant into the reaction space 1401. The oxidizing agent and chemical etchant can be introduced in the vapor phase, in some cases with the aid of a carrier gas (e.g., He, $N_2$, Ar, $H_2$, $CO_2$). The vapor sources can be in fluid communication with a source of an oxidizing agent or a source of a chemical etchant, which may be containers holding each of the oxidizing agent or chemical etchant in liquid phase. In some examples, a carrier gas can be directed through a container having an oxidizing agent or chemical etchant in the liquid phase to generate a vapor having the oxidizing agent or chemical etchant, which may be directed into the reaction space 1401.

The composition of the vapor source into the reaction space 1401 can be varied by controlling the flow rates of separate vapor sources with the aid of various devices, such as, e.g. flow meters, mass flow controllers, and/or gas solenoids. The temperature of the vapor mixture can be varied by passing the vapor mixture through a gas heater or cooler. The pressure of the vapor mixture can be controlled between low vacuum to atmospheric to high pressure using, e.g. pressurizing pumps, compressors, or vacuum pumps.

The substrate holder 1403 can be configured to rotate a substrate on the substrate holder 1403 during substrate etching. The substrate holder 1403 may rotate the substrate at a rate of at least about 1°, 2°, 3°, 4°, 5°, 6°, 7°, 8°, 9°, 10°, 20°, 30°, 40°, 45°, 50°, 60°, 70°, 80°, 90°, 180°, or 360° per minute. As an alternative, or in addition to, the substrate holder 1403 can vibrate the substrate during etching. As an alternative, or in addition to, the substrate holder 1403 can translate the substrate (e.g., from one side to another side of the reaction space 1401) during etching.

In some case, the system 1400 is configured for spray eching. The reaction space 1401 can include one or more spray nozzles configured to deliver a spray or mist of an etchant mixture to a substrate. The substrate, which may be provided as a wafer, can be used as a thermoelectric element subsequent to the formation of holes in, or wires from, the substrate. In some examples, a catalyst patterned wafer is placed on the substrate holder 1403 in the reaction space 1401. An etchant mixture comprising a chemical etchant (e.g., HF) is supplied via spray nozzles to the surface of the wafer while the wafer is spun or agitated on the substrate holder 1403. The etchant mixture can be provide into the reaction space 1401 together with a purging gas (e.g. helium, argon, nitrogen) and/or reactive gas (e.g. $O_2$, $O_3$, $H_2O_2$). The mixture can further a diluent component, such as, for example, water, water vapor, or ethanol.

Aspects of the systems and methods provided herein can be embodied in programming. Various aspects of the technology may be thought of as "products" or "articles of manufacture" typically in the form of machine (or processor) executable code and/or associated data that is carried on or embodied in a type of machine readable medium. Machine-executable code can be stored on an electronic storage unit, such memory (e.g., read-only memory, random-access memory, flash memory) or a hard disk. "Storage" type media can include any or all of the tangible memory of the computers, processors or the like, or associated modules thereof, such as various semiconductor memories, tape drives, disk drives and the like, which may provide non-transitory storage at any time for the software programming. All or portions of the software may at times be communicated through the Internet or various other telecommunication networks. Such communications, for example, may enable loading of the software from one computer or processor into another, for example, from a management server or host computer into the computer platform of an application server. Thus, another type of media that may bear the software elements includes optical, electrical and electromagnetic waves, such as used across physical interfaces between local devices, through wired and optical landline networks and over various air-links. The physical elements that carry such waves, such as wired or wireless links, optical links or the like, also may be considered as media bearing the software. As used herein, unless restricted to non-transitory, tangible "storage" media, terms such as computer or machine "readable medium" refer to any medium that participates in providing instructions to a processor for execution.

Hence, a machine readable medium, such as computer-executable code, may take many forms, including but not limited to, a tangible storage medium, a carrier wave medium or physical transmission medium. Non-volatile storage media include, for example, optical or magnetic disks, such as any of the storage devices in any computer(s) or the like, such as may be used to implement the databases, etc. shown in the drawings. Volatile storage media include dynamic memory, such as main memory of such a computer platform. Tangible transmission media include coaxial cables; copper wire and fiber optics, including the wires that comprise a bus within a computer system. Carrier-wave transmission media may take the form of electric or electromagnetic signals, or acoustic or light waves such as those generated during radio frequency (RF) and infrared (IR) data communications. Common forms of computer-readable media therefore include for example: a floppy disk, a flexible disk, hard disk, magnetic tape, any other magnetic medium, a CD-ROM, DVD or DVD-ROM, any other optical medium, punch cards paper tape, any other physical storage medium with patterns of holes, a RAM, a ROM, a PROM and EPROM, a FLASH-EPROM, any other memory chip or cartridge, a carrier wave transporting data or instructions, cables or links transporting such a carrier wave, or any other medium from which a computer may read programming code and/or data. Many of these forms of computer readable media may be involved in carrying one or more sequences of one or more instructions to a processor for execution.

Example 1

A carrier gas (e.g., nitrogen, argon, helium, carbon dioxide, etc) is bubbled separately through separate solutions of hydrogen peroxide (oxidizing agent) and hydrogen fluoride (chemical etchant). The hydrogen peroxide solution comprises about 30 wt. % hydrogen peroxide in water, and the hydrofluoric acid solution comprises about 49 wt. % hydrofluoric acid in water. The resulting gases, saturated with the vapors of each of hydrogen peroxide and hydrofluoric acid, are mixed to yield a vapor phase mixture, which is subsequently directed to a reaction chamber having a silicon substrate comprising an etching layer. The etching layer comprises silver particles distributed on the silicon surface in a pattern. The vapor phase mixture comprising hydrogen peroxide and hydrofluoric acid is then brought in contact with the substrate and the silver particles of the etching layer. Vapor phase hydrogen peroxide catalytically decomposes at the silver surfaces and oxidizes the underlying silicon, which is then removed by vapor phase hydrofluoric acid from the vapor mixture. In such manner, wires are formed in the silicon substrate.

Example 2

A catalyst material (e.g., silver) is deposited in a blanket fashion over a silicon wafer and subsequently removed in desired or otherwise predetermined locations to produce a catalyst pattern. In one approach, the catalyst material is deposited on the wafer and a masking material is deposited over it. The masking material is then patterned with a resist mask (e.g., photolithography, electron-beam lithography, nanoimprint lithography, block copolymer lithography) to provide a resist pattern that is transferred into the masking material (e.g., by reactive ion etching) where it can serve as a hard mask for etching the underlying catalyst material (e.g., ion milling, reactive ion etching). Exposed portions of the catalyst material are then contacted with an etchant mixture (e.g., HF and $H_2O_2$) to etch the wafer. The masking material can be selected such that, upon exposure of the catalyst material to an etchant mixture, the masking material provides directional etching through the wafer with selectivity against the catalyst material, and that it is robust to serve as a sacrificial mask during a subsequent ion milling or etching step to remove the masking material. In some examples, the masking material is selected from silicon oxide, silicon nitride and silicon oxynitride.

As an alternative, a masking material is first deposited on the wafer using PVD (e.g., evaporation, electron-beam evaporation, sputtering), or CVD (e.g., plasma-enhanced, low pressure, or atmospheric pressure). The masking material is then patterned with a resist mask. The catalyst material is then deposited, in some cases in excess, using PVD, CVD (e.g., metalorganic chemical vapor deposition, electron or ion beam-induced deposition), electrochemical deposition or electro-less deposition. Any excess material is then removed, for example, using a chemical mechanical polishing step and/or ion milling step. Exposed portions of the catalyst material are then contacted with an etchant mixture (e.g., HF and $H_2O_2$) to etch the wafer. The masking material may be selected such that, upon exposure of the catalyst material to an etchant mixture, the masking material provides directional etching of the wafer with selectivity against the wafer, and that it is non-reactive during the catalyst material deposition and is sufficiently robust during removal, such as using chemical mechanical polishing or ion milling. The masking material can be a silicon oxide, such as silicon dioxide. When the masking material is silicon dioxide, wet or dry wafer oxidation can be performed.

While various embodiments described herein have made reference to semiconductor substrates, methods described herein may be employed for use with other types of substrates, such as substrates formed of metallic or insulating (dielectric) materials.

Thermoelectric elements of the present disclosure can be employed for use in cooling systems, such as cooling systems for electronic devices, automobiles, or enclosures (e.g., homes, office buildings). A cooling system can include a fluid flow path that comes in contact with a thermoelectric device that comprises thermoelectric elements of the present disclosure and formed according to methods provided herein. The fluid flow path can deliver a working fluid to the thermoelectric device. In some cases, the cooling system is in thermal contact with a heat source, such as a computer processor or other source of thermal energy. As an alternative, thermoelectric elements of the present disclosure can be employed for use in power generation systems. A power generation system can include a thermoelectric device that comprises thermoelectric elements of the present disclosure and formed according to methods provided herein. The power generation system can be electrically coupled to a load, such as an electronic device, a power grid, and/or an energy storage system (e.g., battery). The power generation system can deliver power upon the application of a temperature gradient across the thermoelectric elements of the thermoelectric device.

Devices, systems and methods provided herein may be combined with or modified by other devices, systems and methods, such as devices and/or methods described in U.S. Pat. No. 7,309,830 to Zhang et al., U.S. Patent Publication No. 2006/0032526 to Fukutani et al., PCT Patent Publication No. WO/2013/109729 to Boukai et al., which are entirely incorporated herein by reference.

It should be understood from the foregoing that, while particular implementations have been illustrated and described, various modifications may be made thereto and are contemplated herein. It is also not intended that the invention be limited by the specific examples provided within the specification. While the invention has been described with reference to the aforementioned specification, the descriptions and illustrations of embodiments of the invention herein are not meant to be construed in a limiting sense. Furthermore, it shall be understood that all aspects of the invention are not limited to the specific depictions, configurations or relative proportions set forth herein which depend upon a variety of conditions and variables. Various modifications in form and detail of the embodiments of the invention will be apparent to a person skilled in the art. It is therefore contemplated that the invention shall also cover any such modifications, variations and equivalents.

What is claimed is:

1. A method for forming a thermoelectric element, comprising:
   (a) providing a substrate in a reaction space, wherein said substrate comprises a semiconductor material, wherein said substrate has a pattern of a metallic material adjacent to said substrate, which metallic material is configured to catalyze the oxidation of said substrate;
   (b) exposing said metallic material to a vapor phase oxidizing agent and a vapor phase chemical etchant; and
   (c) etching said substrate at an etch rate of at least about 0.01 micrometers/second to form holes in or wires from the substrate, thereby forming said thermoelectric element.

2. The method of claim 1, wherein each of said holes or wires has an aspect ratio of at least about 20:1.

3. The method of claim 1, wherein a ratio of oxidizing agent to chemical etchant in said gas is at least about 2:1.

4. The method of claim 1, wherein said substrate is heated to a temperature between about −50° C. and 200° C.

5. The method of claim 1, wherein (a) further comprises:
   providing a mask adjacent to said substrate;
   forming a pattern of holes in said mask, wherein an individual hole exposes an oxide layer adjacent to said substrate;
   exposing said oxide layer to a vapor phase etchant to remove said oxide layer;
   depositing said metallic material adjacent to said substrate; and
   removing said mask.

6. The method of claim 1, further comprising forming a passivation layer on an underside of said substrate prior to etching said substrate.

7. The method of claim 1, further comprising applying an electric field across said substrate while etching said substrate.

8. The method of claim 1, wherein said substrate is exposed to said vapor phase oxidizing agent and said vapor phase chemical etchant simultaneously.

9. The method of claim 1, wherein said vapor phase oxidizing agent and said vapor phase chemical etchant are in the supercritical phase.

10. The method of claim 1, wherein said thermoelectric element has a figure-of-merit of at least about 0.5.

11. A method for forming a thermoelectric element, comprising contacting a metallic material adjacent to a substrate with a vapor phase oxidizing agent and a vapor phase chemical etchant to form holes in or wires from the substrate at an etch rate of at least about 0.1 nanometer/second to form said thermoelectric element, wherein said holes or wires have an aspect ratio of at least about 20:1, and wherein surfaces of said substrate exposed by said holes or wires have a roughness between about 0.5 nanometers (nm) and 50 nm across said holes or wires as measured by transmission electron microscopy.

12. The method of claim 11, wherein an individual hole or wire has a surface with a metal content of at least about 0.000001% as measured by x-ray photoelectron spectroscopy (XPS).

13. The method of claim 11, wherein said substrate is simultaneously contacted with said vapor phase oxidizing agent and said vapor phase chemical etchant.

14. The method of claim 11, wherein said thermoelectric element has a figure-of-merit of at least about 0.5.

15. A method for forming a thermoelectric device, comprising:
   (a) providing particles of a metallic material adjacent to a substrate, wherein said particles of the metallic material each has an Euler Characteristic <2; and
   (b) exposing said particles to an oxidizing agent and a chemical etchant in the gas phase to catalytically etch said substrate at an etch rate of at least about 0.01 micrometers/second to form holes in or wires from the substrate, thereby forming a thermoelectric element of said thermoelectric device.

16. The method of claim 15, wherein (a) further comprises:
   providing a mask adjacent to said substrate, the mask having an array of holes;
   depositing a layer of said metallic material adjacent to said mask and exposed portions of said substrate; and
   removing said mask to provide said particles of said metallic material adjacent to said substrate.

17. The method of claim 16, wherein providing said mask further comprises:
   forming said mask adjacent to said substrate, said mask having three-dimensional structures phase-separated in a polymer matrix; and
   removing said three-dimensional structures, thereby providing said holes in said polymer matrix, which holes expose portions of said substrate.

18. The method of claim 15, wherein said particles of said metallic material each has an Euler Characteristic equal to zero.

19. The method of claim 15, wherein said thermoelectric element has a figure-of-merit of at least about 0.5.

* * * * *